United States Patent
Islam et al.

(10) Patent No.: US 11,094,682 B2
(45) Date of Patent: Aug. 17, 2021

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Rabiul Islam, Hsinchu (TW); Chuei-Tang Wang, Taichung (TW); Stefan Rusu, Sunnyvale, CA (US); Weiwei Song, San Jose, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/744,194

(22) Filed: Jan. 16, 2020

(65) Prior Publication Data

US 2021/0225824 A1 Jul. 22, 2021

(51) Int. Cl.
| | |
|---|---|
| *H01L 23/31* | (2006.01) |
| *H01L 21/56* | (2006.01) |
| *G02B 6/12* | (2006.01) |
| *H01L 25/16* | (2006.01) |
| *H01L 23/367* | (2006.01) |
| *H01L 23/00* | (2006.01) |

(52) U.S. Cl.
CPC ........ *H01L 25/167* (2013.01); *G02B 6/12004* (2013.01); *H01L 21/568* (2013.01); *H01L 23/3107* (2013.01); *H01L 23/367* (2013.01); *H01L 24/16* (2013.01); *H01L 2224/16148* (2013.01); *H01L 2224/16227* (2013.01)

(58) Field of Classification Search
CPC ............................ G02B 6/4248; G02B 6/4253
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,250,403 B2 * | 2/2016 | Thacker ............... G02B 6/4274 |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Sung H Pak
(74) *Attorney, Agent, or Firm* — JCIPRNET

(57) ABSTRACT

A package structure includes a package component, a stacked die package, a plurality of optical fibers and a heat spreading structure. The stacked die package is disposed on and electrically connected to the package component. The stacked die package includes a first semiconductor die and a plurality of second semiconductor dies. The first semiconductor die has a plurality of first bonding elements. The second semiconductor dies are disposed on the first semiconductor die and have a plurality of second bonding elements, wherein the plurality of first bonding elements and the plurality of second bonding elements are facing one another and bonded together through hybrid bonding. The plurality of optical fibers is attached to the plurality of second semiconductor dies of the stacked die package. The heat spreading structure is disposed on the package component and surrounding the stacked die package.

20 Claims, 26 Drawing Sheets

(56) References Cited

U.S. PATENT DOCUMENTS

| | | |
|---|---|---|
| 9,496,189 B2 | 11/2016 | Yu et al. |
| 10,211,970 B2 * | 2/2019 | Kamgaing .......... H04B 10/6165 |
| 10,333,623 B1 * | 6/2019 | Liao ....................... G02B 6/428 |
| 10,598,875 B2 * | 3/2020 | Xie .......................... H01L 33/54 |
| 2012/0177381 A1 * | 7/2012 | Dobbelaere ............ H04B 10/43 |
| | | 398/139 |
| 2014/0321803 A1 * | 10/2014 | Thacker .............. H01L 25/0652 |
| | | 385/14 |

* cited by examiner

PACKAGE STRUCTURE AND METHOD OF FABRICATING THE SAME

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1A to FIG. 1J are schematic views of various stages in a method of fabricating a stacked die package according to some exemplary embodiments of the present disclosure.

DETAILED DESCRIPTION

Figure 1A:
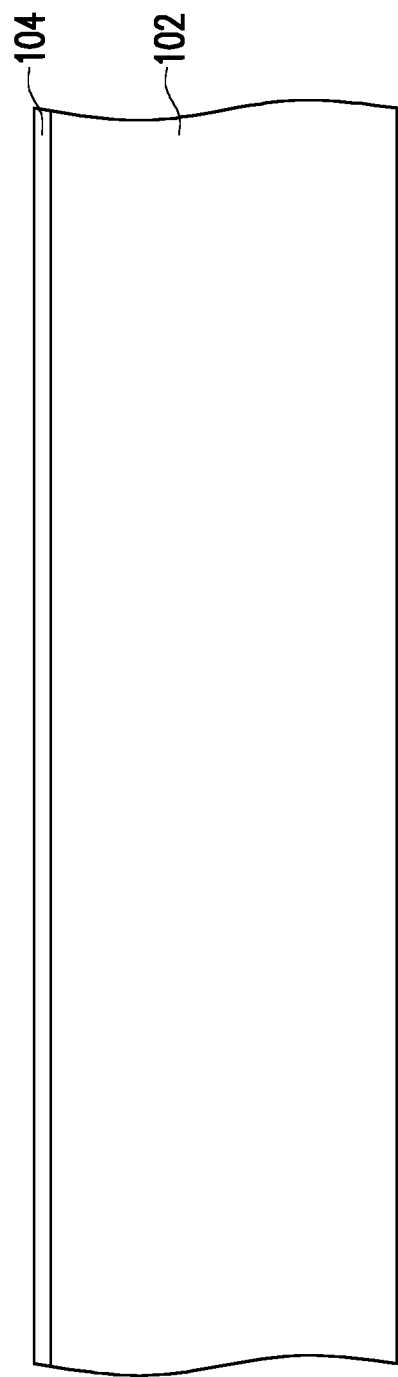

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic views of various stages in a method of fabricating a stacked die package according to some exemplary embodiments of the present disclosure. Referring to FIG. 1A, a carrier 102 is provided. In some embodiments, the carrier 102 may be a glass carrier or any suitable carrier for carrying a semiconductor wafer or a reconstituted wafer for the manufacturing method of the stacked die package. In some embodiments, the carrier 102 is coated with a debond layer 104. The material of the debond layer 104 may be any material suitable for bonding and de-bonding the carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 104 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

Figure 1B:
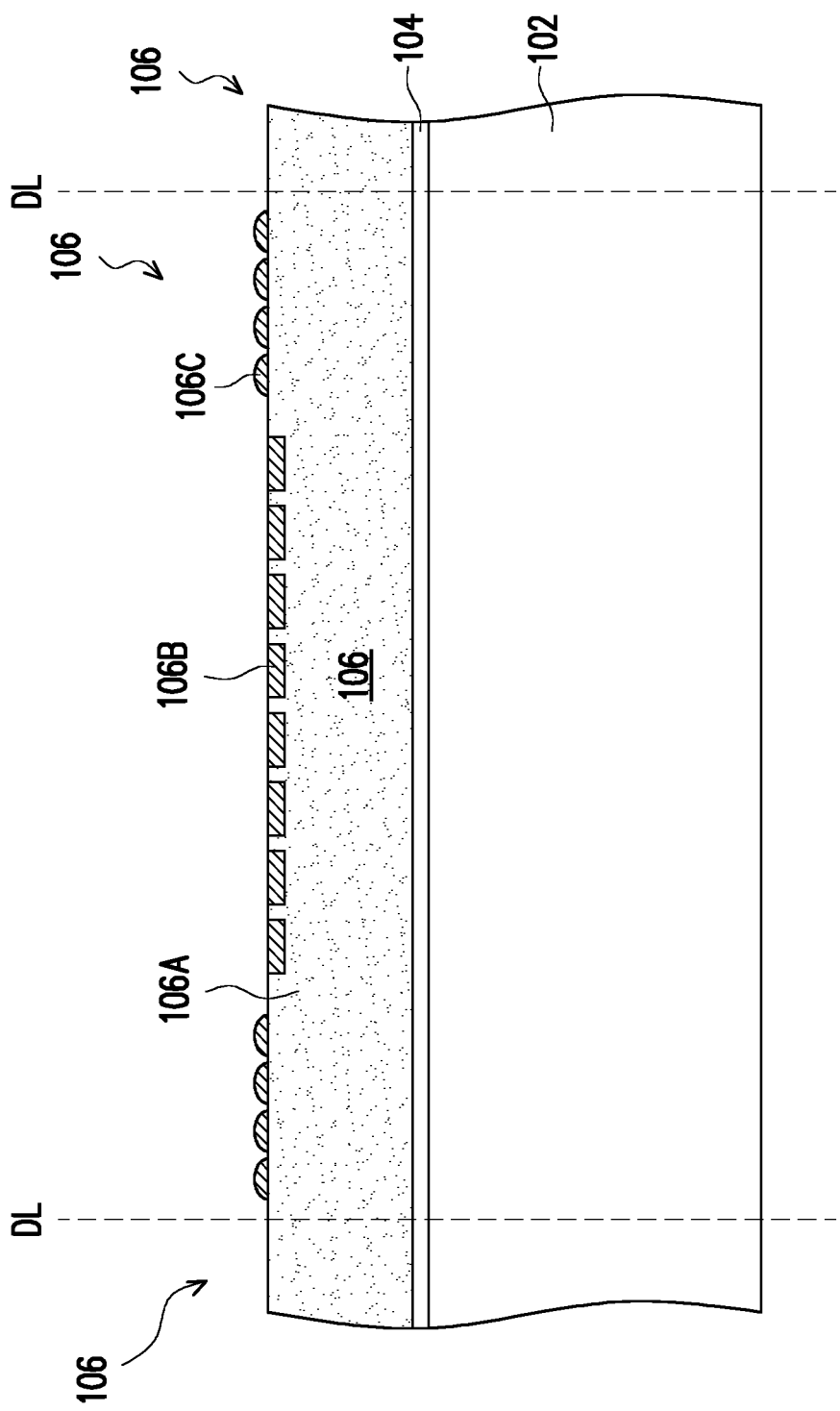

Referring to FIG. 1B, a plurality of first semiconductor dies 106 is placed on the carrier 102. In some embodiments, the plurality of first semiconductor dies 106 are attached to the debond layer 104 through a die-attach film (not shown). The plurality of first semiconductor dies 106 may be separated from one another by dicing through the dicing line DL in subsequent steps. In some embodiments, each of the first semiconductor dies 106 includes a first semiconductor substrate 106A, a plurality of first conductive features 106B and a plurality of first bonding elements 106C. In certain embodiments, the first semiconductor dies 106 may be an electronic die including electronic devices.

In some embodiments, the first semiconductor substrate 106A may be a bulk silicon substrate or a silicon-on-insulator (SOI) substrate, and further includes active components (e.g., transistors or the like) and optionally passive components (e.g., resistors, capacitors, inductors or the like) formed therein. The first semiconductor substrate 106A may also be formed of other semiconductor materials such as germanium, SiGe, a III-V compound semiconductor material, or the like. In some embodiments, the plurality of first conductive features 106B are embedded in the first semiconductor substrate 106A, wherein a top surface of the first conductive features 106B is coplanar with a top surface of the first semiconductor substrate 106A. The first conductive features 106B may be aluminum pads, copper pads or other suitable metal pads, the disclosure is not limited thereto. In some embodiments, the first bonding elements 106C are located over the top surface of the first semiconductor substrate 106A. In certain embodiments, the first bonding elements 106C may be conductive studs. For example, a material of the first bonding elements 106C may be copper (Cu) or other suitable conductive/metallic materials. In some embodiments, the material of the first conductive features 106B may be the same as the material of the first bonding elements 106C. However, the disclosure is not limited thereto. In alternative embodiments, the material of the first conductive features 106B may be different than the material of the first bonding elements 106C.

Figure 1C:
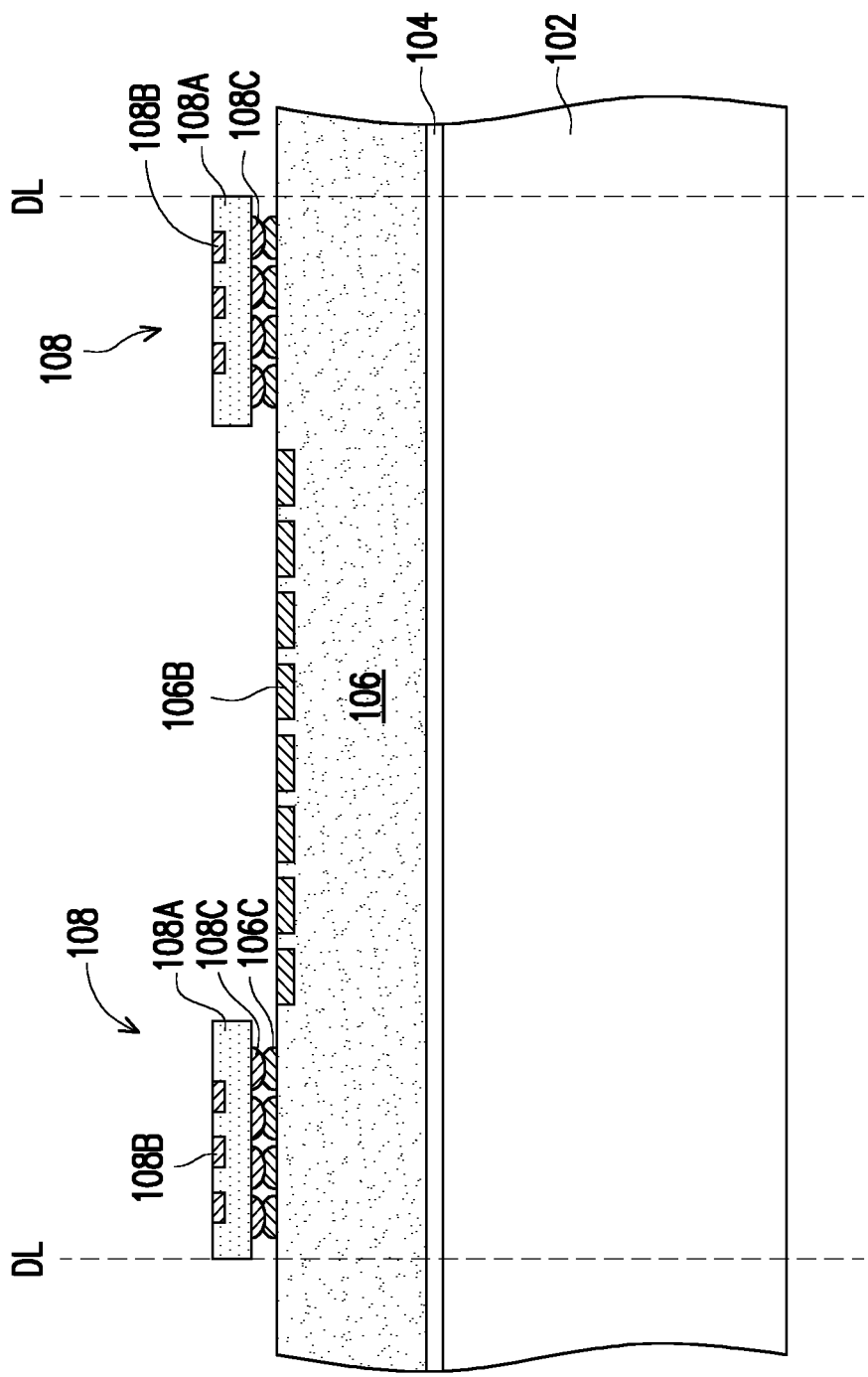
Figure 1D:
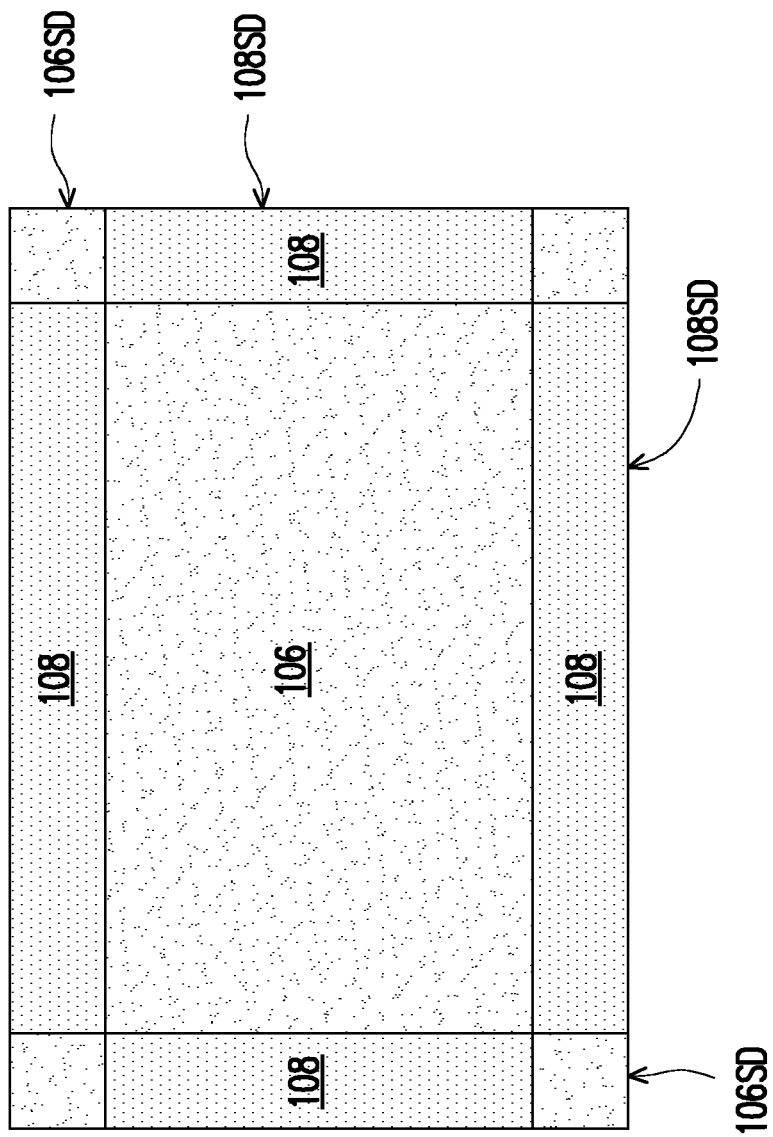

Referring to FIG. 1C, in a next step, a plurality of second semiconductor dies 108 may be stacked on each of the first semiconductor die 106. For example, referring to FIG. 1D, which is a top view of the structure shown in FIG. 1C, there are four second semiconductor dies 108 stacked on one first semiconductor die 106. In some embodiments, a side surface 108SD of each of the plurality of second semiconductor dies 108 is aligned with side surfaces 106SD of the first semiconductor die 106. In certain embodiments, the second semiconductor dies 108 may be photonics dies including optical devices.

For example, in some embodiments, the first semiconductor die 106 (electronic die) acts as a central processing unit, which includes controlling circuits for controlling the operation of the devices in the second semiconductor dies 108 (photonic dies). In certain embodiments, the first semiconductor die 106 (electronic die) may include the circuits for processing the electrical signals converted from the optical signals in the second semiconductor dies 108 (photonic dies). For example, the first semiconductor die 106 (electronic die) may include driver circuitry for controlling optical modulators in the second semiconductor dies 108 (photonic dies), and may further include gain amplifiers for amplifying the electrical signals received from the photodetectors in the second semiconductor dies 108 (photonic dies). In some embodiments, the first semiconductor die 106 (electronic die) may also exchange electrical signals with the second semiconductor dies 108 (photonic dies).

Referring back to FIG. 1C, in some embodiments, each of the second semiconductor dies 108 includes a second semiconductor substrate 108A, a plurality of second conductive features 108B, and a plurality of second bonding elements 108C. In some embodiments, the second semiconductor substrate 108A may be bulk silicon substrate or a silicon-on-insulator (SOI) substrate, and further includes active components (e.g., transistors or the like) and optionally passive components (e.g., resistors, capacitors, inductors or the like) formed therein. The second semiconductor substrate 108A may also be formed of other semiconductor materials such as germanium, SiGe, a III-V compound semiconductor material, or the like. In some embodiments, the second conductive features 108B are embedded in the second semiconductor substrate 108A, wherein a top surface of the second conductive features 108B is coplanar with a top surface of the second semiconductor substrate 108A. The second conductive features 108B may be aluminum pads, copper pads or other suitable metal pads, the disclosure is not limited thereto. In some embodiments, the second bonding elements 108C are located over the bottom surface of the second semiconductor substrate 108A opposite to where the second conductive features 108B are located. In certain embodiments, the second bonding elements 108C may be conductive studs. For example, a material of the second bonding elements 108C may be copper (Cu) or other suitable conductive/metallic materials. In some embodiments, the material of the second conductive features 108B may be the same as the material of the second bonding elements 108C. However, the disclosure is not limited thereto. In alternative embodiments, the material of the second conductive features 108B may be different than the material of the second bonding elements 108C.

As illustrated in FIG. 1C, the second semiconductor dies 108 are stacked on the first semiconductor die 106 in a way that the first bonding elements 106C and the second bonding elements 108C are facing one another. In some embodiments, the first bonding elements 106C and the second bonding elements 108C are bonded together through hybrid bonding. In certain embodiments, the first bonding elements 106C are physically joined with the second bonding elements 108C. In the exemplary embodiment, the first bonding elements 106C and the second bonding elements 108C are copper, and they are bonded together through copper-copper hybrid bonding. However, the disclosure is not limited thereto, and other materials may be appropriately selected so that the hybrid bonding between the first bonding elements 106C and the second bonding elements 108C may be sufficiently achieved.

Figure 1E:
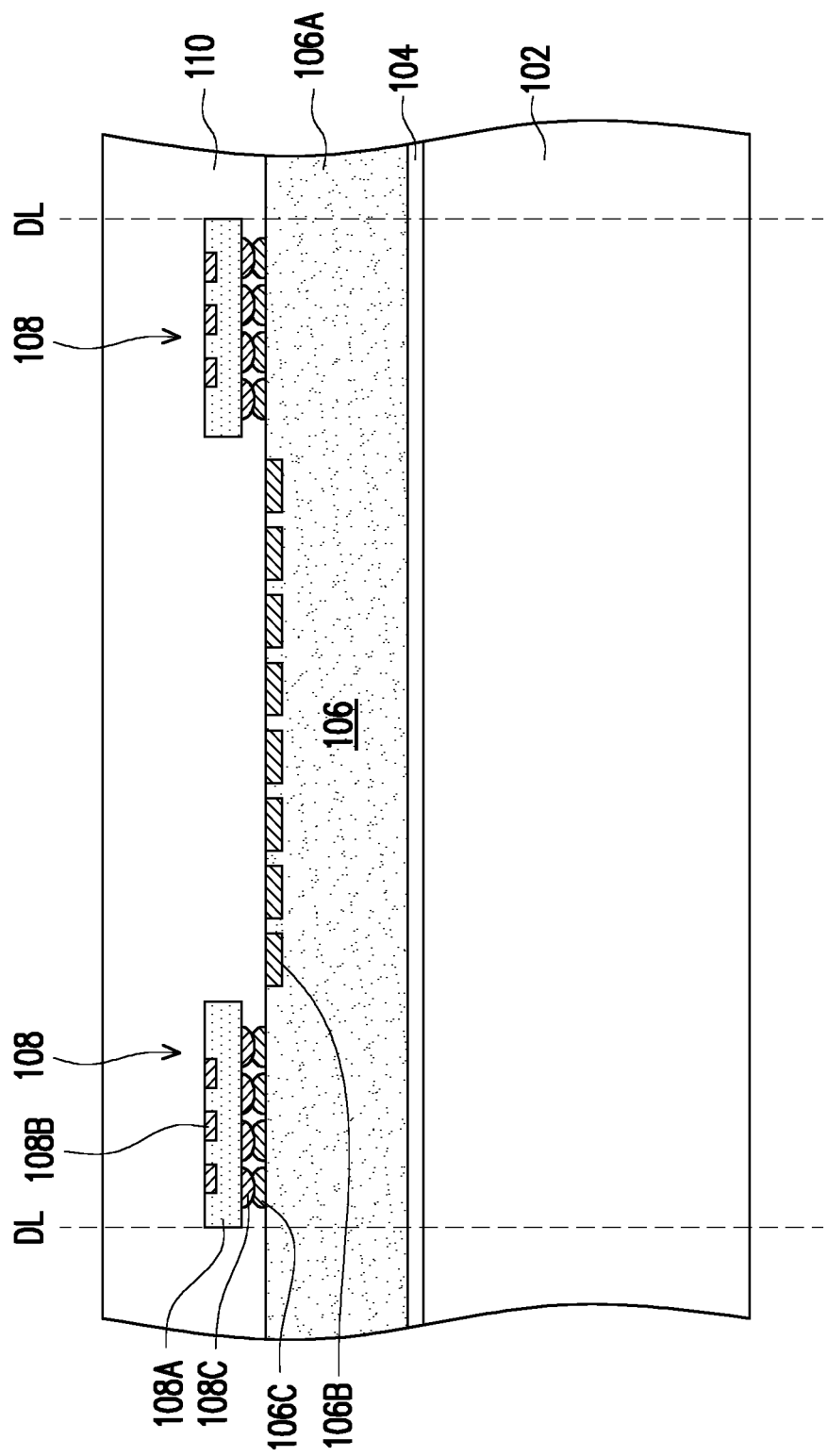

Referring to FIG. 1E, in a next step, an insulating material 110 is formed on the first semiconductor die 106 and over the second semiconductor dies 108. In some embodiments, the insulating material 110 is formed through, for example, a compression molding process, filling up the gaps between adjacent first bonding elements 106C and second bonding elements 108C. In certain embodiments, the insulating material 110 covers and encapsulate the second semiconductor dies 108. In some embodiments, the insulating material 110 includes polymers (such as epoxy resins, phenolic resins, silicon-containing resins, or other suitable resins), dielectric materials having low permittivity (Dk) and low loss tangent (DO properties, or other suitable materials. In an alternative embodiment, the insulating material 110 may include an acceptable insulating encapsulation material. In some embodiments, the insulating material 110 may further include inorganic filler or inorganic compound (e.g. silica, clay, and so on) which can be added therein to optimize coefficient of thermal expansion (CTE) of the insulating material 110. The disclosure is not limited thereto.

Figure 1F:
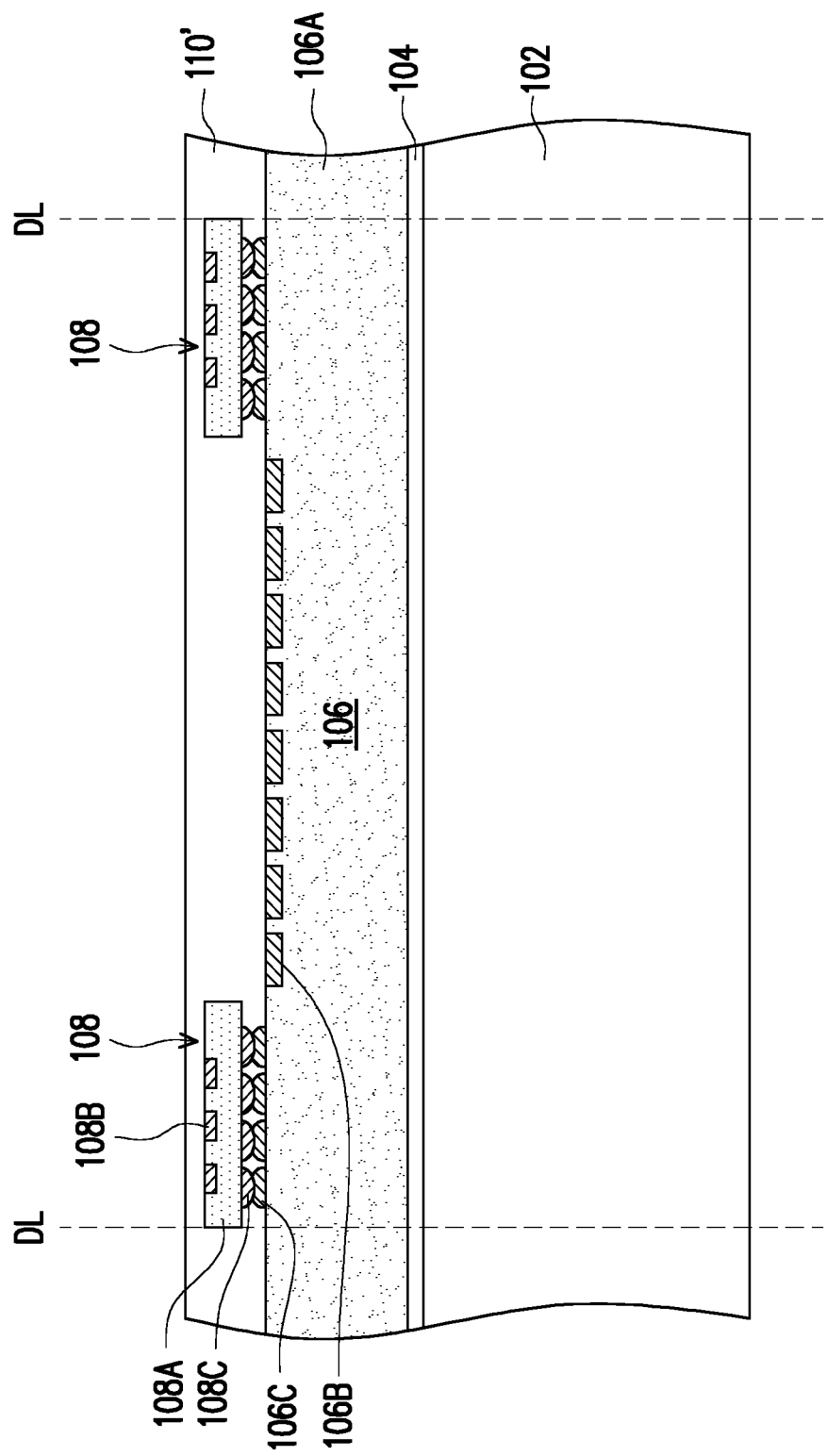

Referring to FIG. 1F, in some embodiments, the insulating material 110 is partially removed to form an insulating encapsulant 110'. In some embodiments, the insulating material 110 is ground or polished by a planarization step. For example, the planarization step is performed through a mechanical grinding process and/or a chemical mechanical polishing (CMP) process. In some embodiments, the insulating encapsulant 110' still covers and encapsulate the second semiconductor dies 108 after the planarization step. In some embodiments, the insulating encapsulant 110' may have a substantially coplanar top surface after the planarization step. In certain embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1G:
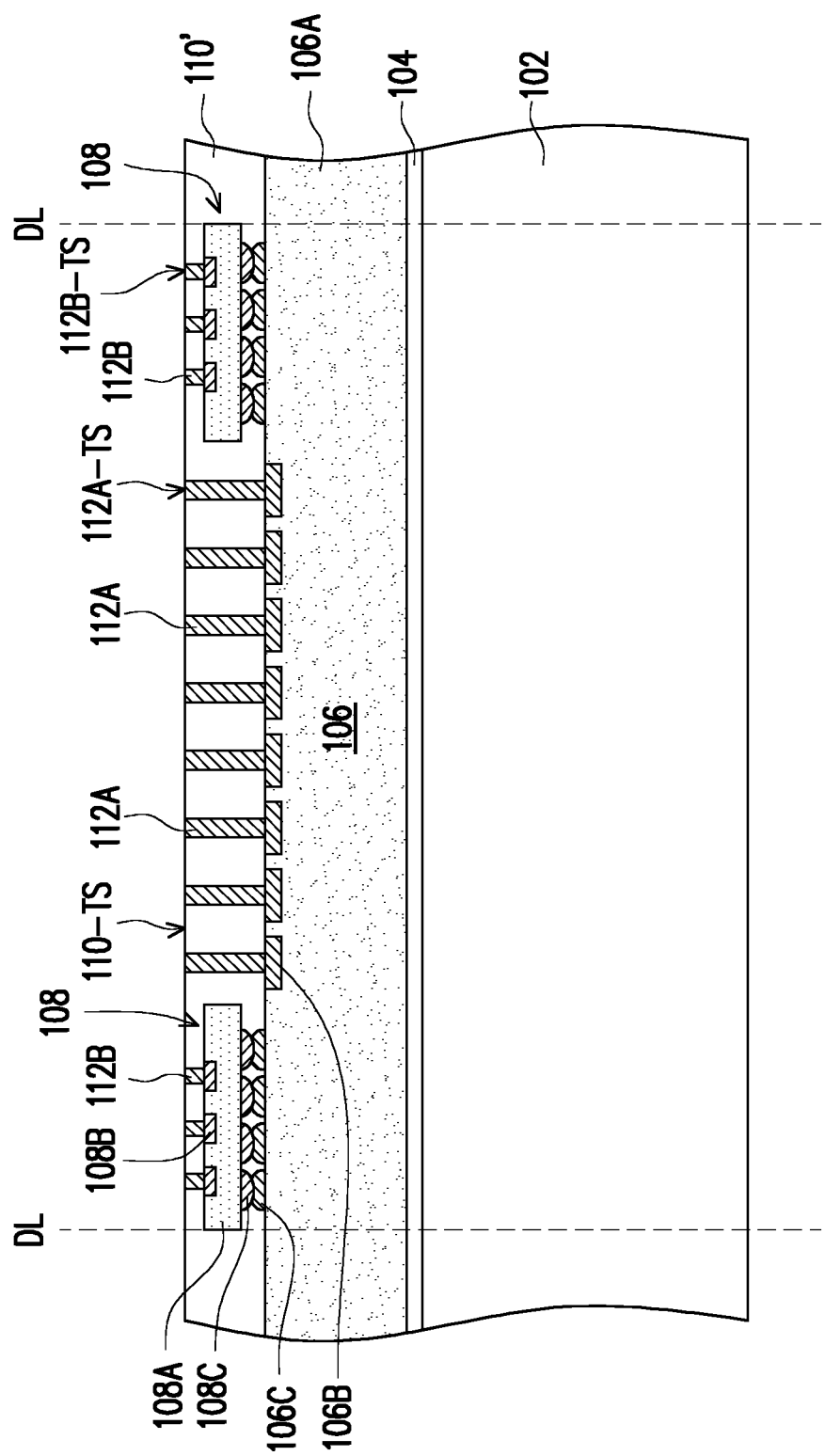

Referring to FIG. 1G, after the grinding/polishing step, a plurality of through dielectric vias 112A and 112B may be formed within the insulating encapsulant 110'. In some embodiments, the through dielectric vias 112A are electrically connected to the first conductive features 106B of the first semiconductor die 106, while the through dielectric vias 112B are electrically connected to the second conductive features 108B of the second semiconductor dies 108. In one embodiment, the through dielectric vias 112A and 112B may be formed by forming openings in the insulating encapsulant 110', then forming a metallic material (not shown) filling up the openings by electroplating or deposition. In some embodiments, a material of the through dielectric vias 112A and 112B may include a metal material such as copper or copper alloys, or the like. However, the disclosure is not limited thereto.

In some embodiments, after forming the through dielectric vias 112A and 112B, a mechanical grinding process and/or a chemical mechanical polishing (CMP) process may be optionally performed to partially remove the through dielectric vias 112A and 112B and the insulating encapsulant 110'. For example, the through dielectric vias 112A and 112B and the insulating encapsulant 110' are partially removed to form coplanar surfaces. In the exemplary embodiment, after the mechanical grinding or chemical mechanical polishing (CMP) steps, a top surface 112A-TS of the through dielectric vias 112A, a top surface 112B-TS of the through dielectric vias 112B, and a top surface 110-TS pf the insulating encapsulant 110' are coplanar and levelled with one another. Similarly, a cleaning step may be performed to clean and remove the residue generated from the grinding and polishing step.

Figure 1H:
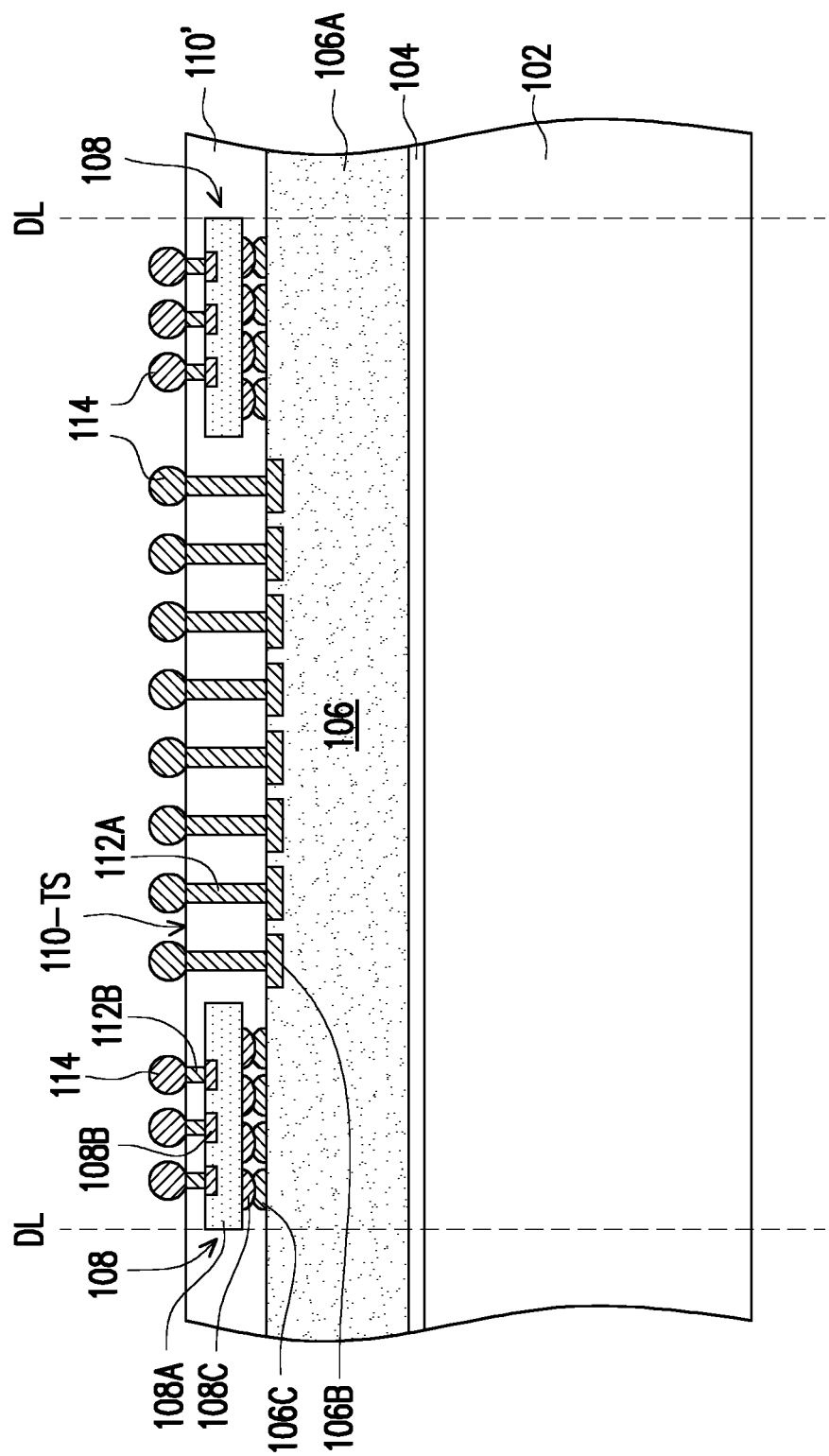
Figure 11:
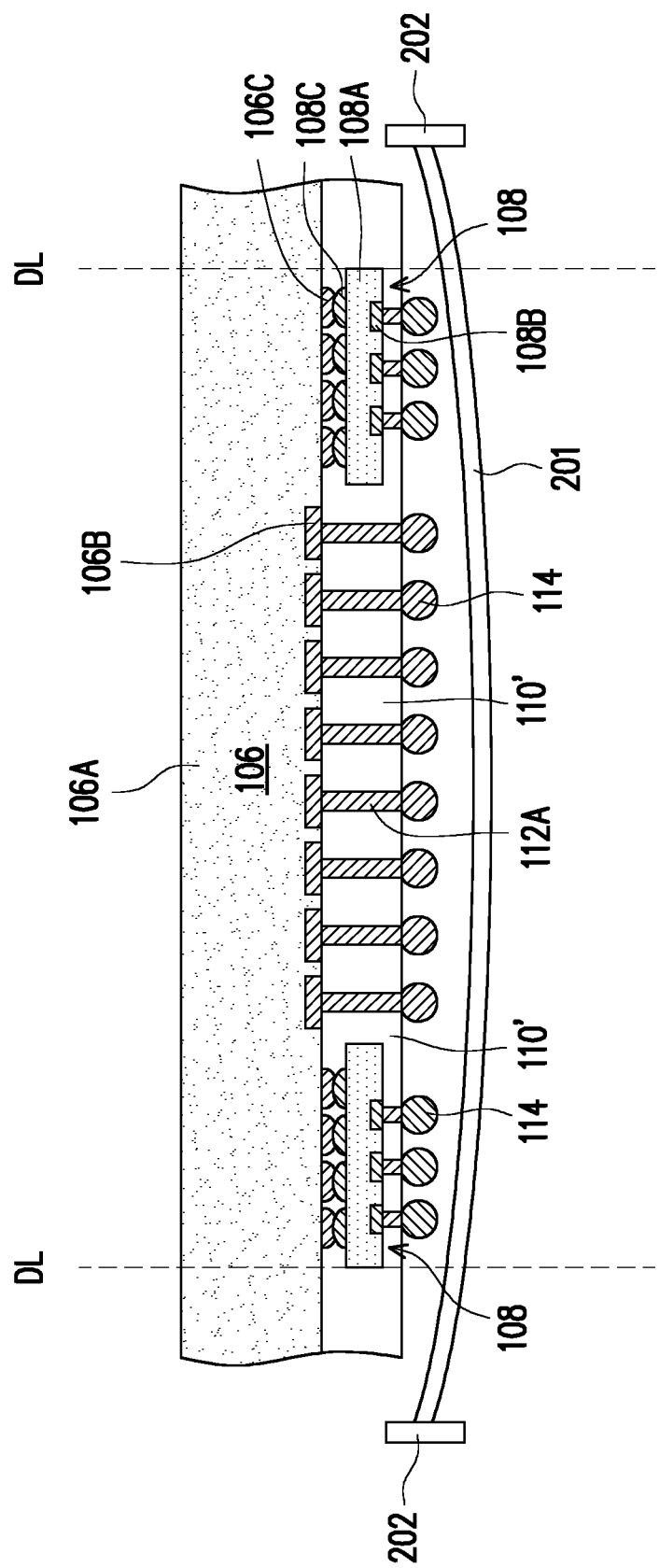

Referring to FIG. 1H, in a next step, a plurality of conductive terminals 114 may be formed over the insulating encapsulant 110' and being electrically connected to the plurality of through dielectric vias 112A and 112B. In some embodiments, the conductive terminals 114 are electrically connected to the first semiconductor die 106 and the second semiconductor dies 108 through the through dielectric vias 112A and 112B. In some embodiments, the conductive terminals 114 are electrically connected to the plurality of through dielectric vias 112A and 112B through a plurality of conductive pads (not shown). However, the disclosure is not limited thereto. In some alternative embodiments, the conductive pads may be omitted. In some embodiments, the conductive terminals 114 are disposed on the through dielectric vias 112A and 112B by a ball placement process or reflow process. In certain embodiments, the conductive terminals 114 may be micro-bumps, controlled collapse chip connection (C4) bumps, or the like.

Referring to FIG. 1I, after placing the plurality of conductive terminals 114 on the through dielectric vias 112A and 112B, the structure shown in FIG. 1H may be turned upside down and attached to a tape 201 (e.g., a dicing tape) supported by a frame 202. As illustrated in FIG. 1I, the carrier 102 is de-bonded and is separated from the first semiconductor die 106. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape 201 is used to secure the package before de-bonding the carrier 102 and the debond layer 104. After the de-bonding process, a backside surface of the first semiconductor die 106 may be revealed or exposed.

Figure 1J:
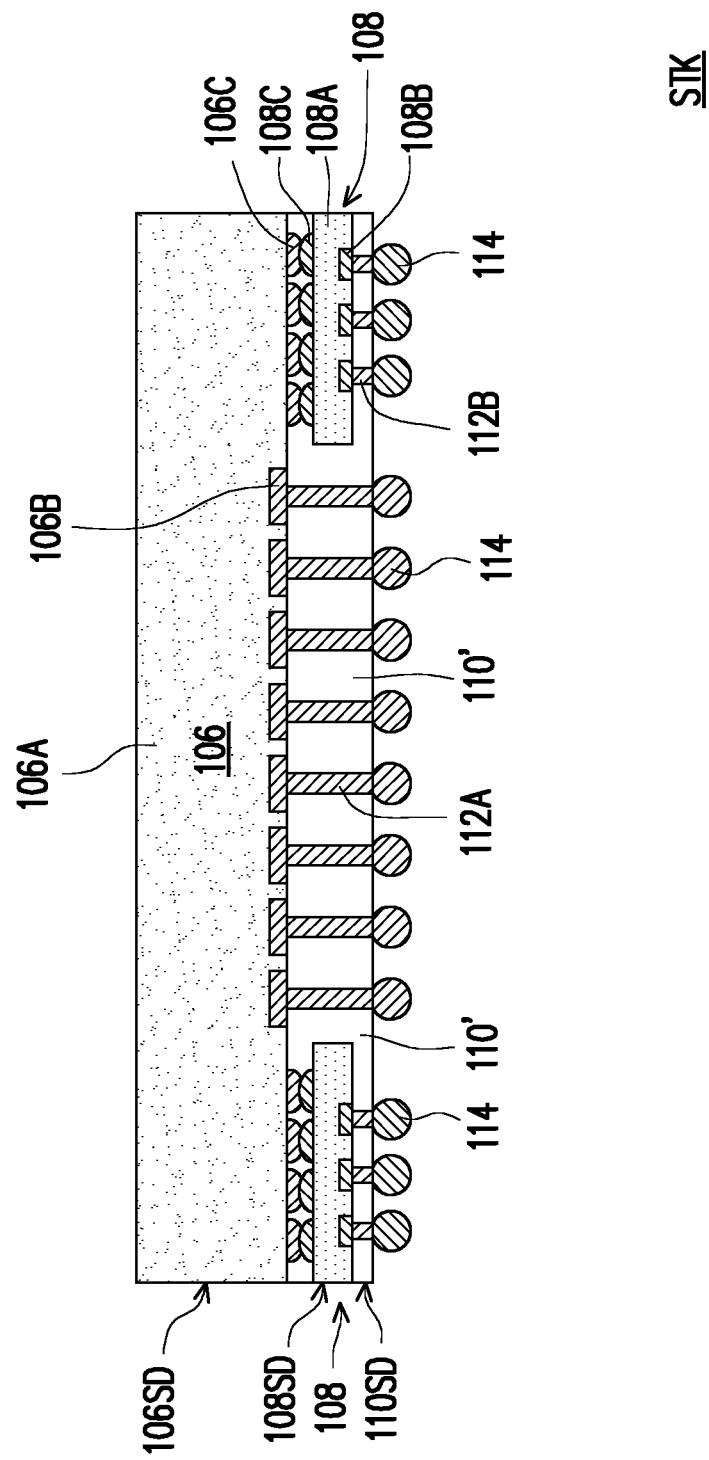

Referring to FIG. 1J, after the de-bonding process, a dicing process is performed along the dicing lines DL (shown in FIG. 1I) to cut the whole wafer structure (cutting through the insulating encapsulant 110' and the first semiconductor die 106) to form a plurality of stacked die packages STK. In some embodiments, the dicing process is performed to separate the plurality of first semiconductor dies 106 from one another. In the exemplary embodiment, the dicing process is a wafer dicing process including mechanical blade sawing or laser cutting. After the dicing process, each of the stacked die package STK includes a plurality of second semiconductor dies 108 bonded to one first semiconductor die 106. In some embodiments, a side surface 108SD of each of the second semiconductor dies 108 is aligned with side surfaces 106-SD of the first semiconductor die 106. Furthermore, side surfaces 110SD of the insulating encapsulant 110' may be further aligned or leveled with the side surface 108SD of the second semiconductor dies 108 and the side surface 106-SD of the first semiconductor die 106.

Figure 2A:
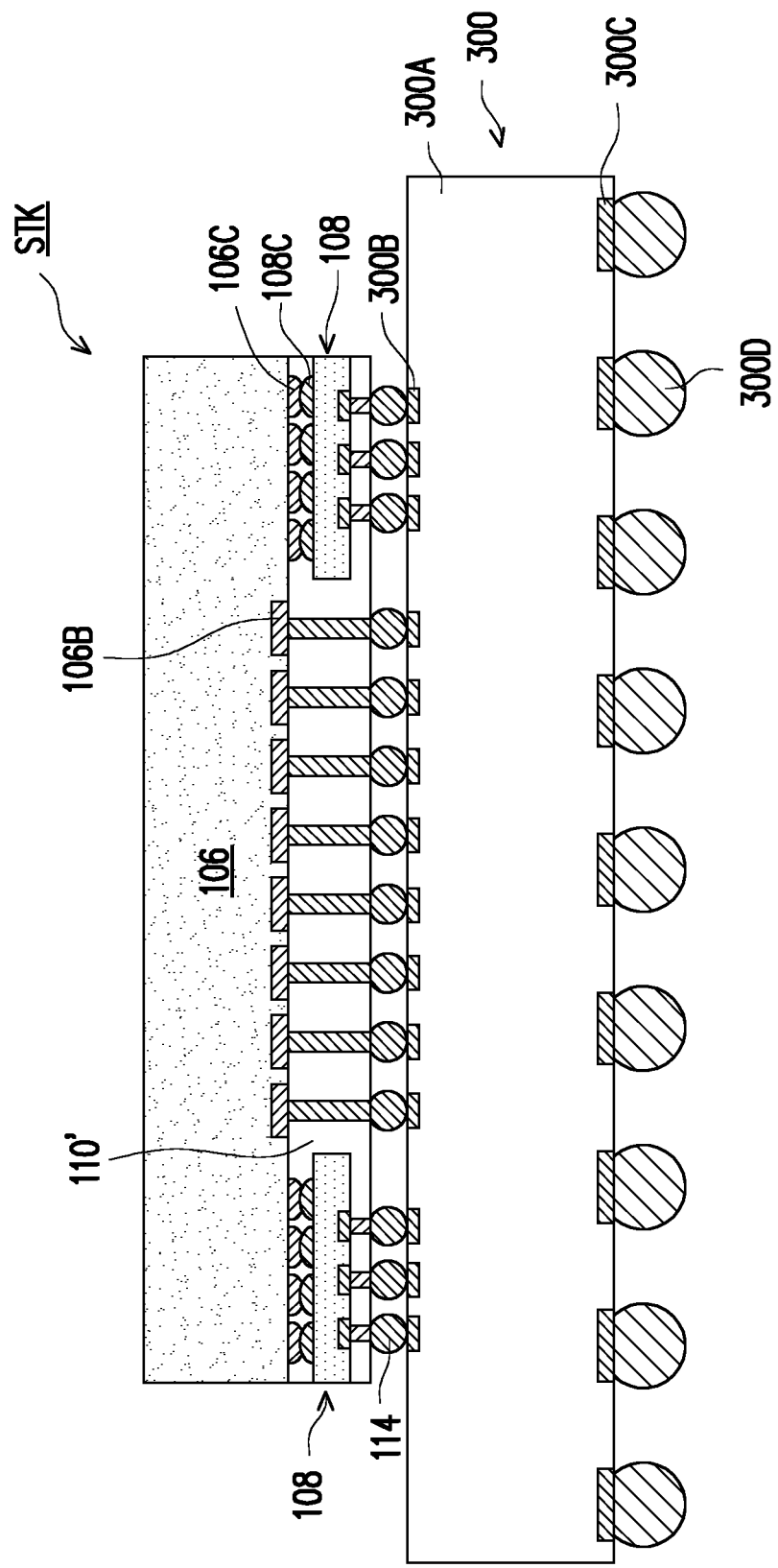
FIG. 2A to FIG. 2D are schematic views of various stages in a method of fabricating a package structure according to some other exemplary embodiments of the present disclosure.

FIG. 2A to FIG. 2D are schematic views of various stages in a method of fabricating a package structure according to some other exemplary embodiments of the present disclosure. Referring to FIG. 2A, a package component 300 is provided. The package component 300 may be a package substrate, integrated fan-out (InFO) packages, fan-in packages, printed circuit board, interposers or the like. The disclosure is not limited thereto.

In some embodiments, the package component 300 includes a substrate 300A, a plurality of bonding pads 300B and 300C, and electrical connectors 300D. In some embodiments, the plurality of bonding pads 300B and 300C are respectively distributed on two opposite sides of the substrate 300A, and are exposed for electrically connecting with later-formed elements/features. In some embodiments, a plurality of metallization layers or vias (not shown) may be embedded in the substrate 300A, and together provide routing function for the substrate 300A. For example, in some embodiments, some of the bonding pads 300B on one surface may be electrically connected to some of the bonding pads 300C located on an opposite surface through the metallization layers or vias. In some embodiments, the bonding pads 300B and 300C may include metal pads or metal alloy pads. In some embodiments, the electrical connectors 300D are connected to the bonding pads 300C of the substrate 300A. In other words, the electrical connectors 300D may be electrically connected to the substrate 300A through the bonding pads 300C. In some embodiments, the electrical connectors 300D are, for example, solder balls or ball grid array (BGA) balls.

As illustrated in FIG. 2A, the stacked die package STK illustrated in FIG. 1J is disposed on the package component 300. For example, the stacked die package STK is bonded to the package component 300 through the plurality of conductive terminals 114. In some embodiments, the stacked die package STK is bonded to the package component 300 through flip chip bonding. In some embodiments, a reflow process is performed so that the conductive terminals 114 are electrically and physically connected to the bonding pads 300B of the package component 300.

Figure 2B:
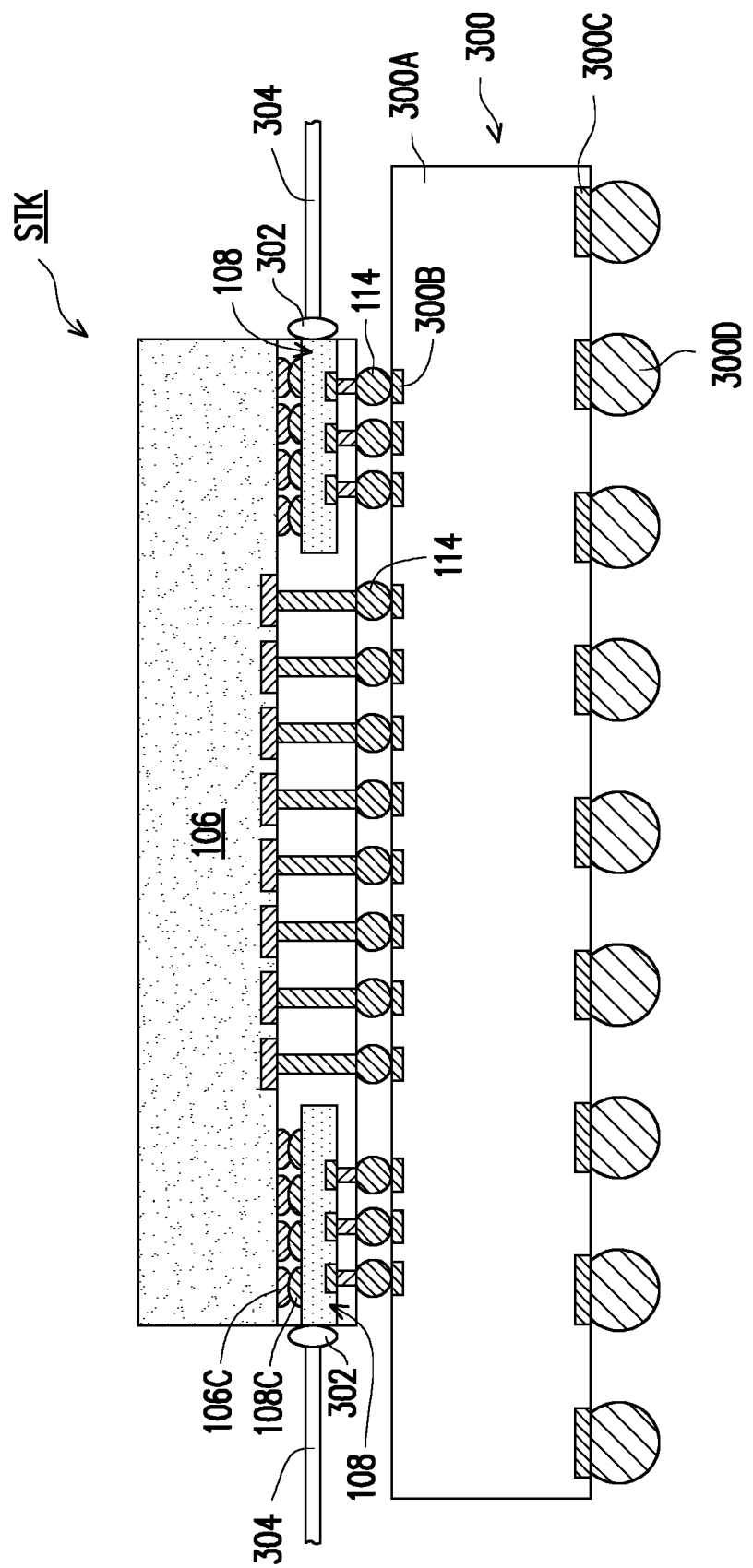
Figure 2C:
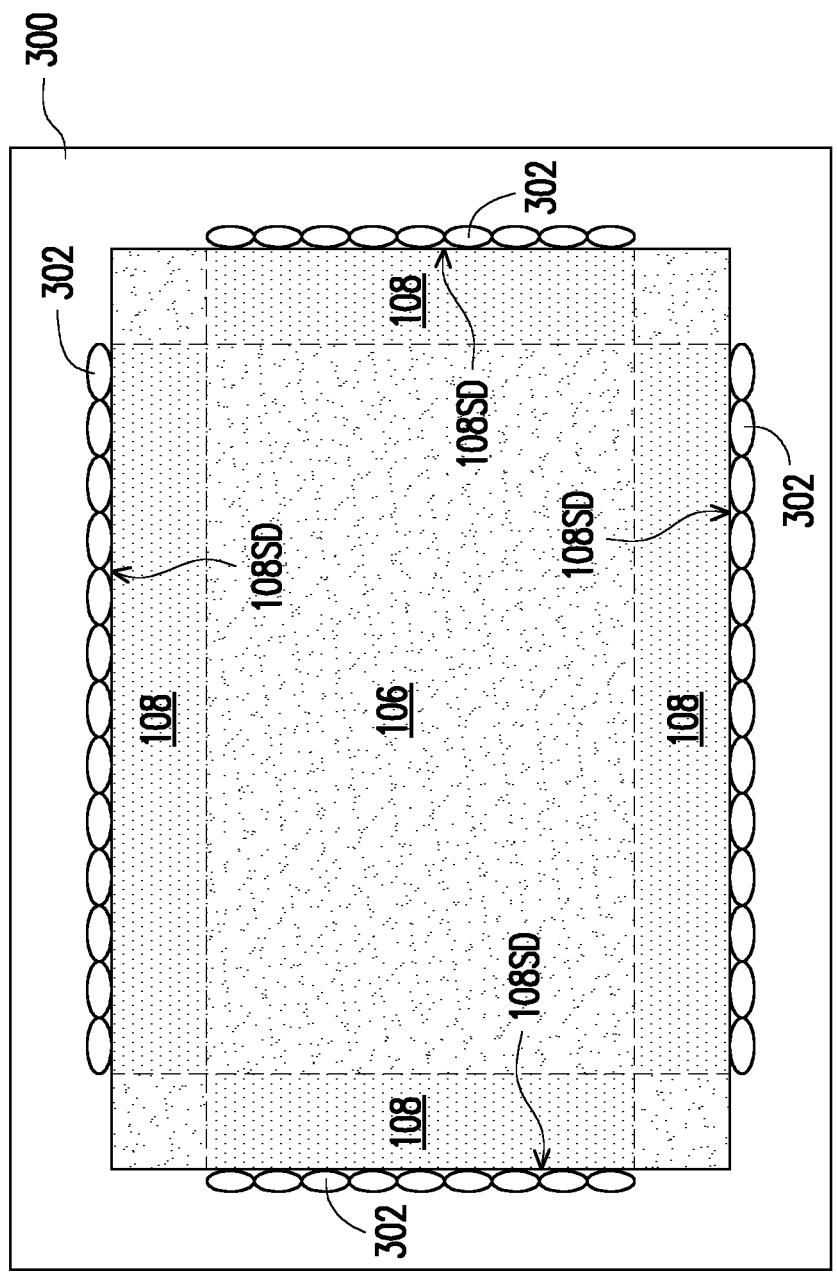

Referring to FIG. 2B, after bonding the stacked die package STK to the package component 300, a plurality of optical lens 302 may be attached to plurality of second semiconductor dies 108. For example, as illustrated in FIG. 2C, which is a top view of the structure shown FIG. 2B, optical lens 302 are attached along the side surfaces 108SD of the second semiconductor dies 108 to form a lens array. For example, a plurality of optical lens 302 are attached to the side surface 108SD of each second semiconductor die 108 to form the lens array. Referring back to FIG. 2B, a plurality of optical fibers 304 may be attached to the side surfaces 108SD of each of the second semiconductor dies 108 through the plurality of optical lens 302. In some embodiments, light transmitted in the optical fibers 304 is projected onto the optical lens 302, and/or the light emitted out of the optical lens 302 is received by the optical fibers 304.

Figure 2D:
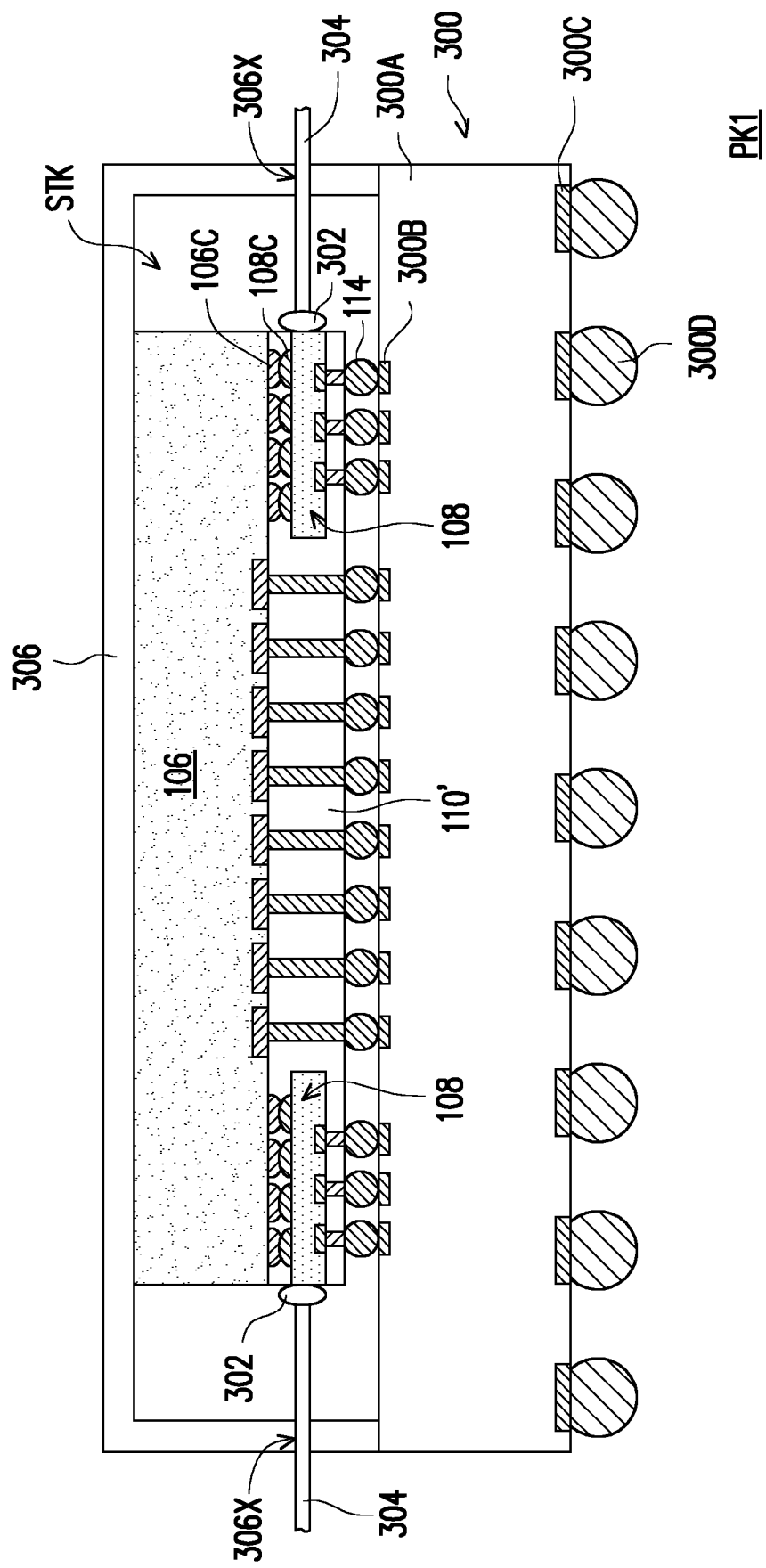

Referring to FIG. 2D, in a next step, a heat spreading structure 306 may be disposed on the package component 300 to surround the stacked die package STK. In some embodiments, the heat spreading structure 306 may include openings 306X that allows for the optical fibers 304 to pass through. A material of the heat spreading structure 306 is not particularly limited as long as it can provide sufficient heat spreading function. For example, materials having high thermal conductivity such as copper, aluminum or the like may be utilized. The disclosure is not limited thereto. In some embodiments, the heat spreading structure 306 is responsible for transferring heat from the stacked die package STK to a heat sink or heat exchanger. Up to here, a package structure PK1 according to some embodiments of the present disclosure may be accomplished.

Figure 3:
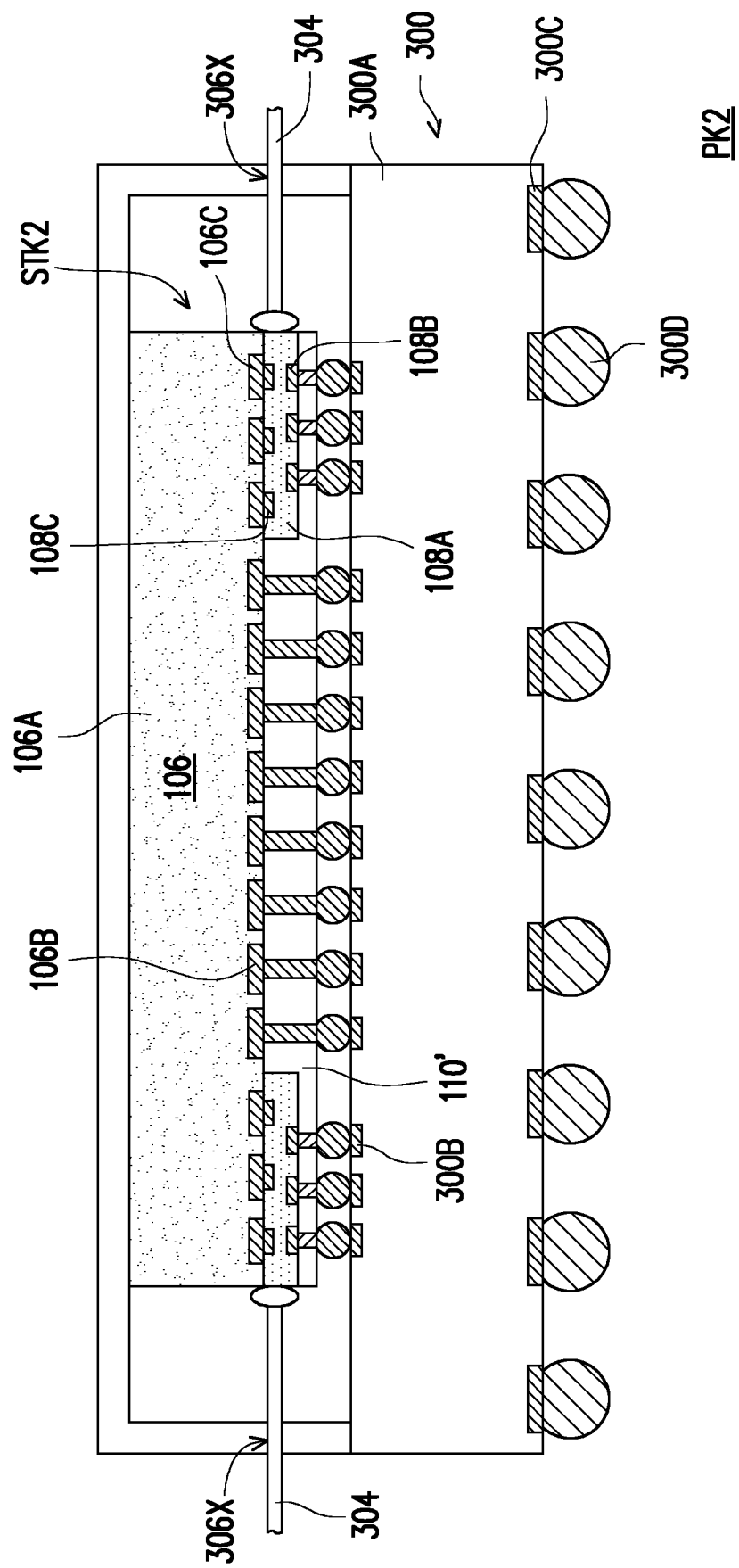
FIG. 3 is a schematic sectional view of a package structure according to some exemplary embodiments of the present disclosure.

FIG. 3 is a schematic sectional view of a package structure according to some exemplary embodiments of the present disclosure. The package structure PK2 illustrated in FIG. 3 is similar to the package structure PK1 illustrated in FIG. 2D. Therefore, the same reference numerals are used to refer to the same or liked parts, and its detailed description will be omitted herein. The difference between the embodiments is in the design of the first bonding elements 106C and second bonding elements 108C.

For example, in the embodiment of FIG. 2D, the first bonding elements 106C and second bonding elements 108C are conductive studs located on a surface of the first semiconductor substrate 106A and the second semiconductor substrate 1068A, while the first bonding elements 106C and second bonding elements 108C are surrounded by the insulating encapsulant 110'. In comparison, as illustrated in the stacked die package STK2 of FIG. 3, the first bonding elements 106C and second bonding elements 108C are conductive pads. For example, the first bonding elements 106C are embedded in the first semiconductor substrate 106A aside the first conductive features 106B, wherein a top surface of the first bonding elements 106C is coplanar with a top surface of the first conductive features 106B and a top surface of the first semiconductor substrate 106A. Furthermore, in some embodiments, the second bonding elements 108C are embedded in the second semiconductor substrate 108A opposite to the surface where the second conductive features 108B are located. In certain embodiments, a top surface of the second bonding elements 108C is coplanar with a top surface of the second semiconductor substrate 108A. As illustrated in FIG. 3, since the first bonding elements 106C and second bonding elements 108C are conductive pads embedded within the substrate (106A, 108A), the first bonding elements 106C may be hybrid bonded to the second bonding elements 108C in a way that the first semiconductor substrate 106A contacts the second semiconductor substrate 108A.

Figure 4:
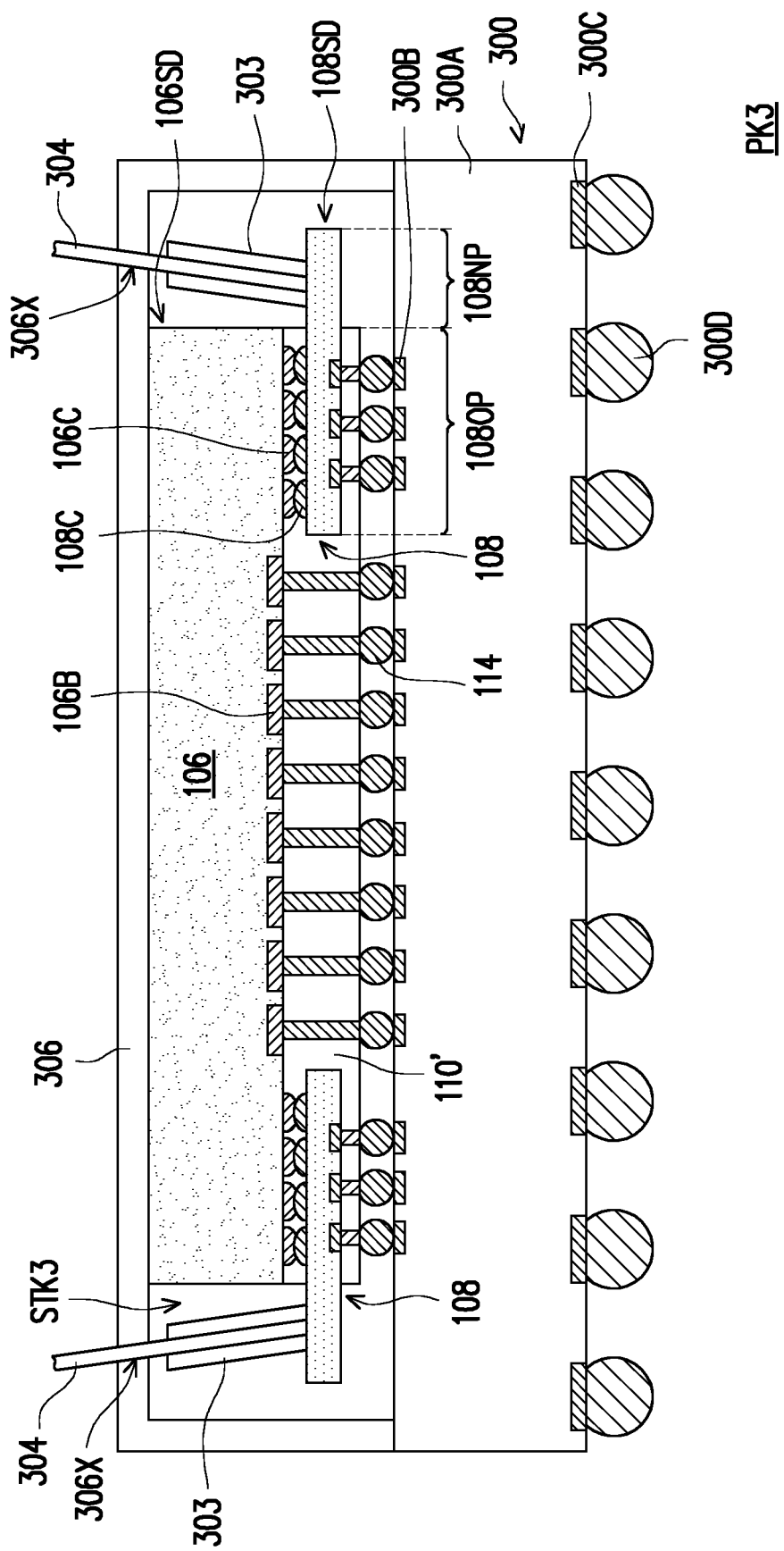
FIG. 4 is a schematic sectional view of a package structure according to some other exemplary embodiments of the present disclosure.

FIG. 4 is a schematic sectional view of a package structure according to some other exemplary embodiments of the present disclosure. The package structure PK3 illustrated in FIG. 4 is similar to the package structure PK1 illustrated in FIG. 2D. Therefore, the same reference numerals are used to refer to the same or liked parts, and its detailed description will be omitted herein. The difference between the embodiments is in the design of the second semiconductor dies 108.

As illustrated in FIG. 4, in the stacked die package STK3, the second semiconductor dies 108 are disposed on the first semiconductor die 106 to have an overlapping portion 1080P and a non-overlapping portion 108NP with the first semiconductor die 106. For example, in some embodiments, the non-overlapping portion 108NP is a portion of the first semiconductor die 106 that protrudes out from the insulating encapsulant 110'. In other words, the side surfaces 106SD of the first semiconductor die 106 are not aligned with the side surfaces 108SD of the second semiconductor dies 108. In some embodiments, the second semiconductor dies 108 having protruded portions is formed by controlling the dicing steps. For example, a first dicing step may be performed to remove portions of the first semiconductor die 106 and the insulating encapsulant 110', while a second dicing step may be performed to separate adjacent second semiconductor dies 108 (those located on another first semiconductor die 106) from one another. The disclosure is not limited thereto.

Furthermore, in the exemplary embodiment, the optical fibers 304 may be attached to a top surface of the non-overlapping portion 108NP of each of the second semiconductor dies 108. In certain embodiments, the optical fibers 304 is attached to the second semiconductor dies 108 through a grating coupler 303. The grating coupler 303 is attached to the top surface of the second semiconductor dies 108, and have the function of receiving light or transmitting light. In some embodiments, light transmitted in the optical fibers 304 is projected onto the grating coupler 303, and/or the light emitted out of the grating coupler 303 is received by the optical fiber 304.

Figure 5:
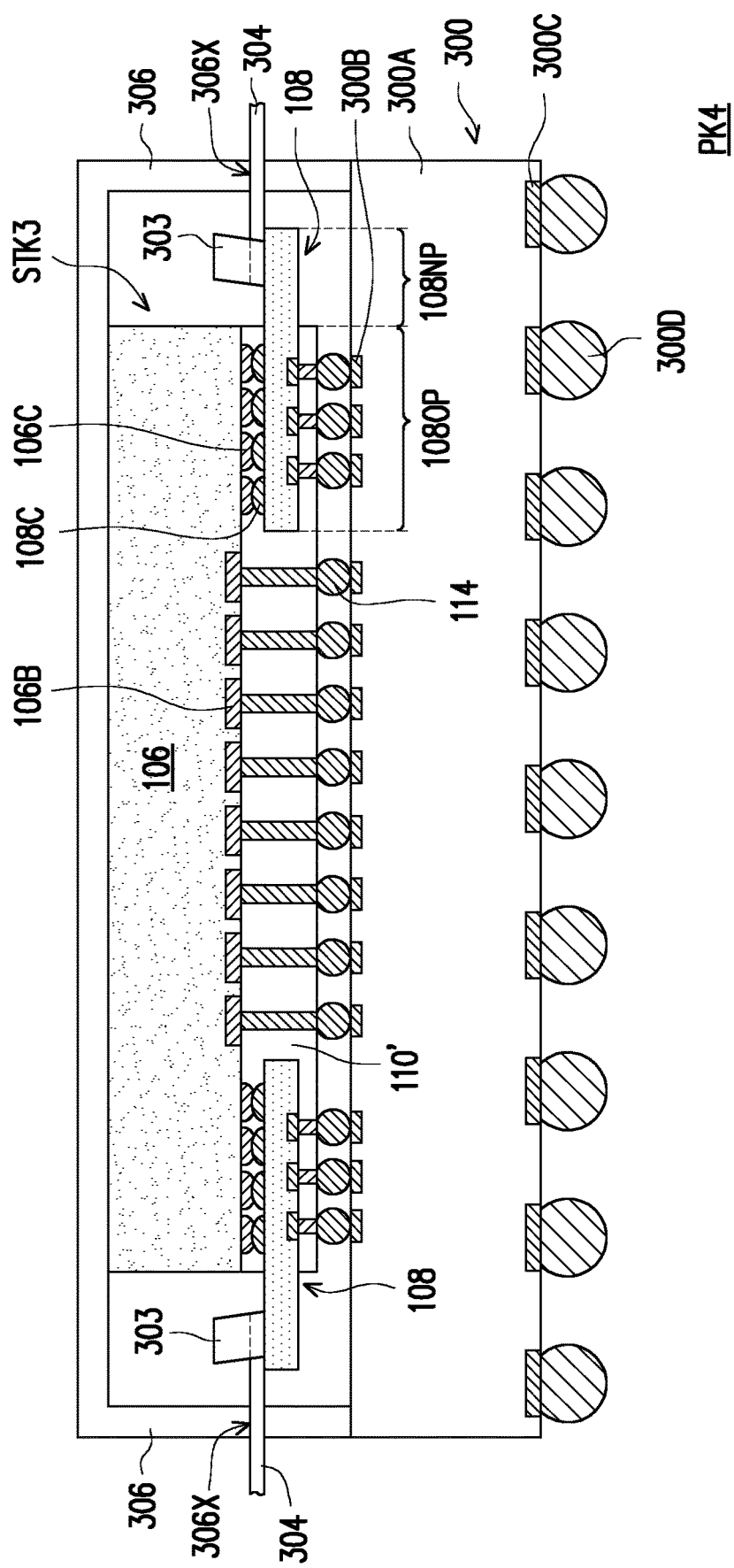
FIG. 5 is a schematic sectional view of a package structure according to some other exemplary embodiments of the present disclosure.

FIG. 5 is a schematic sectional view of a package structure according to some other exemplary embodiments of the present disclosure. The package structure PK4 illustrated in FIG. 5 is similar to the package structure PK3 illustrated in FIG. 4. Therefore, the same reference numerals are used to refer to the same or liked parts, and its detailed description will be omitted herein. The difference between the embodiments is in the way of attaching the optical fibers 304.

For example, in the embodiment of FIG. 4, the optical fibers 304 is attached to the second semiconductor die 108 by passing through openings 306X located at a top portion of the heat spreading structure 306. In comparison, referring to FIG. 5, the optical fibers 304 are attached to the second semiconductor die 108 by passing through openings 306X located at side portions of the heat spreading structure 306. In other words, the optical fibers 304 may be attached to the grating coupler 303 from one side of the grating coupler 303, while the grating coupler 303 is attached to a top surface of the second semiconductor die 306.

Figure 6A:
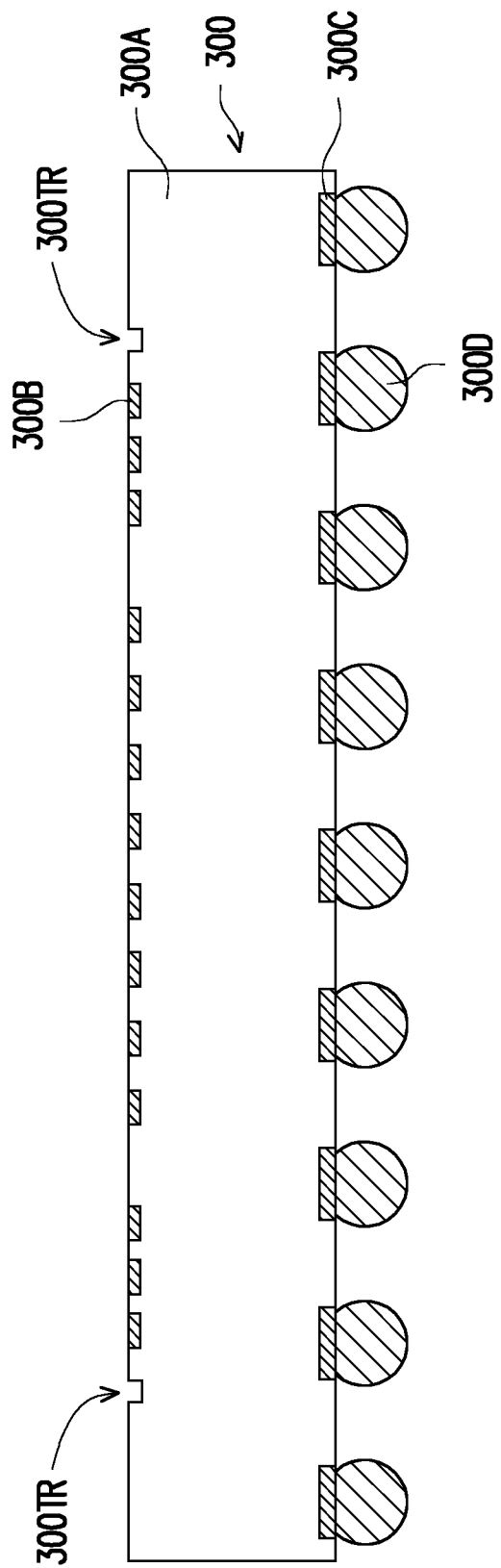
FIG. 6A to FIG. 6C are schematic views of various stages in a method of fabricating a package structure according to some other exemplary embodiments of the present disclosure.
Figure 6B:
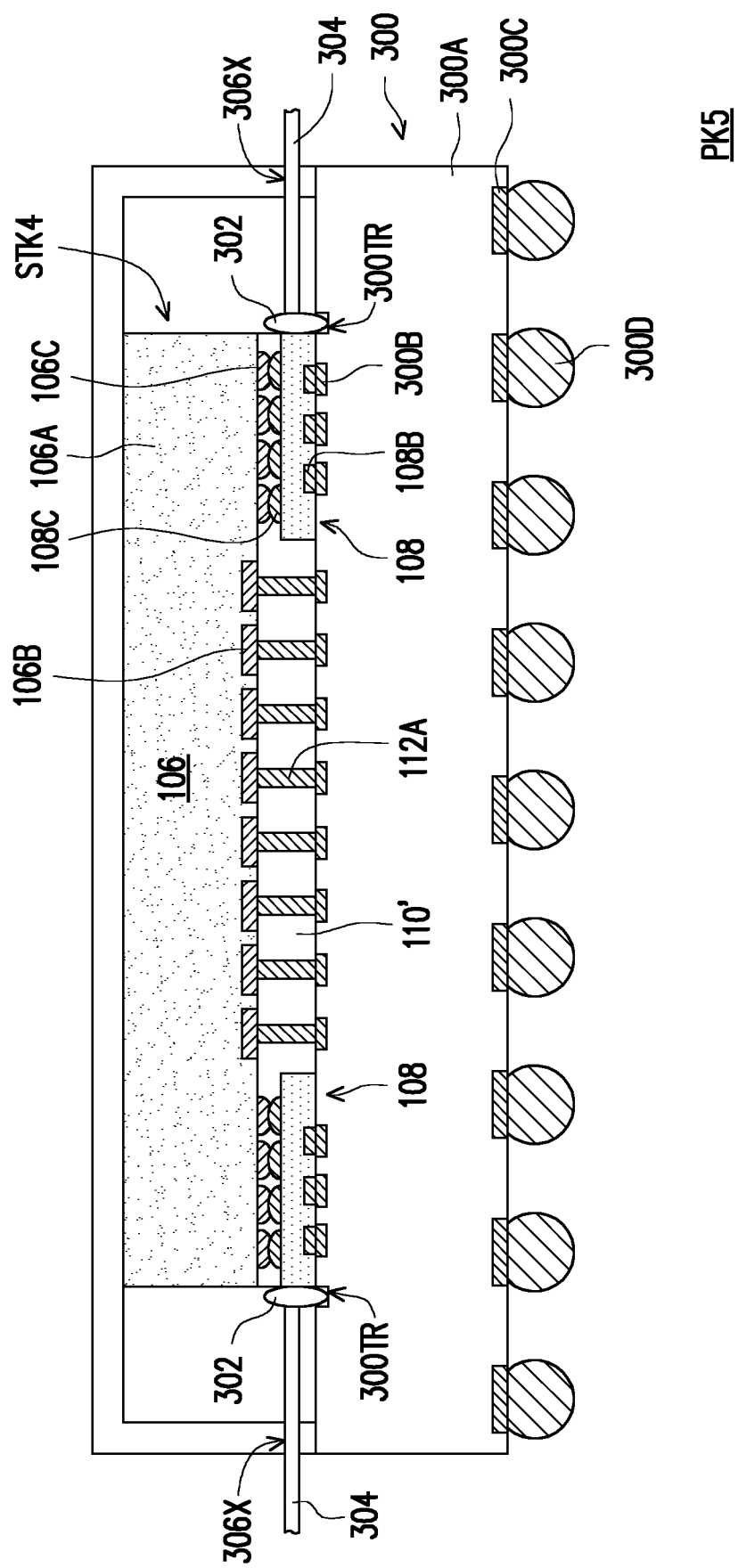
Figure 6C:
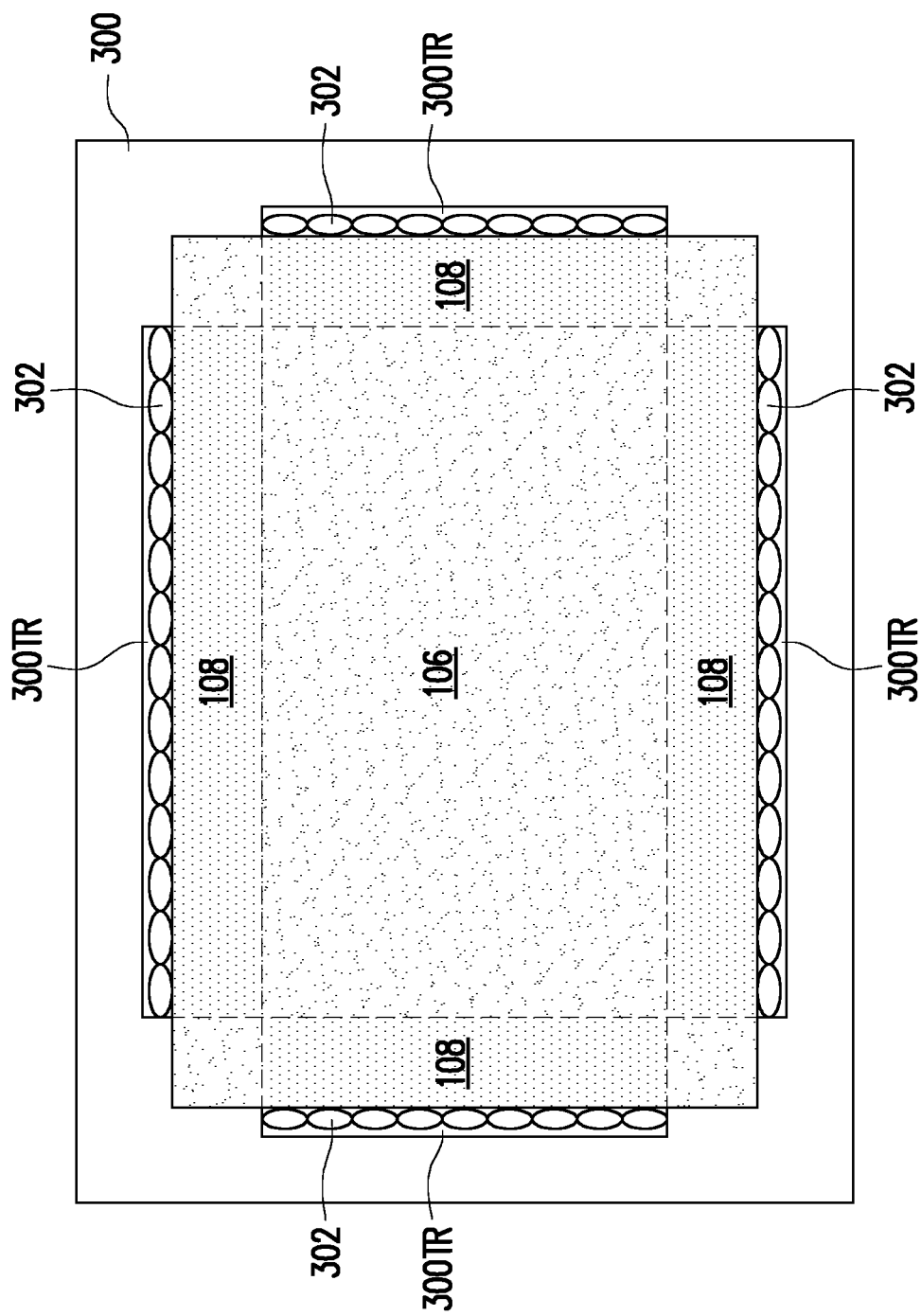

FIG. 6A to FIG. 6C are schematic views of various stages in a method of fabricating a package structure according to some other exemplary embodiments of the present disclosure. The method of fabricating the package structure PK5 illustrated in FIG. 6A to FIG. 6C is similar to the method of fabricating the package structure PK1 illustrated in FIG. 2A to FIG. 2D. Therefore, the same reference numerals are used to refer to the same or liked parts, and its detailed description will be omitted herein.

As illustrated in FIG. 6A, a package component 300 is provided. In some embodiments, the package component 300 is patterned to define a plurality of trenches 300TR in the substrate 300A. Referring to FIG. 6B, in a next step, a stacked die package STK4 may be bonded to the package component 300 so that the plurality of optical lens 302 are disposed within the plurality of trenches 300TR of the package component 300. For example, referring to FIG. 6C, which is a top view of the structure shown in FIG. 6B (omitting heat spreading structure 306 and optical fibers 304), there are four trenches 300TR aligned on the side of the second semiconductor dies 108, whereby the plurality of optical lens 302 are locating within the plurality of trenches 300TR to form a lens array.

Referring back to FIG. 6B, in the exemplary embodiment, conductive terminals 114 shown in FIG. 2D are omitted from the package structure PK5 illustrated in FIG. 6B. Furthermore, in some embodiments, the second conductive features 108B of the second semiconductor dies 108 have bottom surfaces that are aligned with surfaces of the insulating encapsulant 110' and the through dielectric vias 112A. In other words, the bottom surface of the second semiconductor dies 108 (photonic dies) may be also aligned with the bottom surface of the insulating encapsulant 110'. In some embodiments, the through dielectric vias 112A and the second conductive features 108B of the second semiconductor dies 108 may be physically and electrically attached to the bonding pads 300B for providing electrical connection between the stacked die package STK4 and the package component 300.

Figure 7:
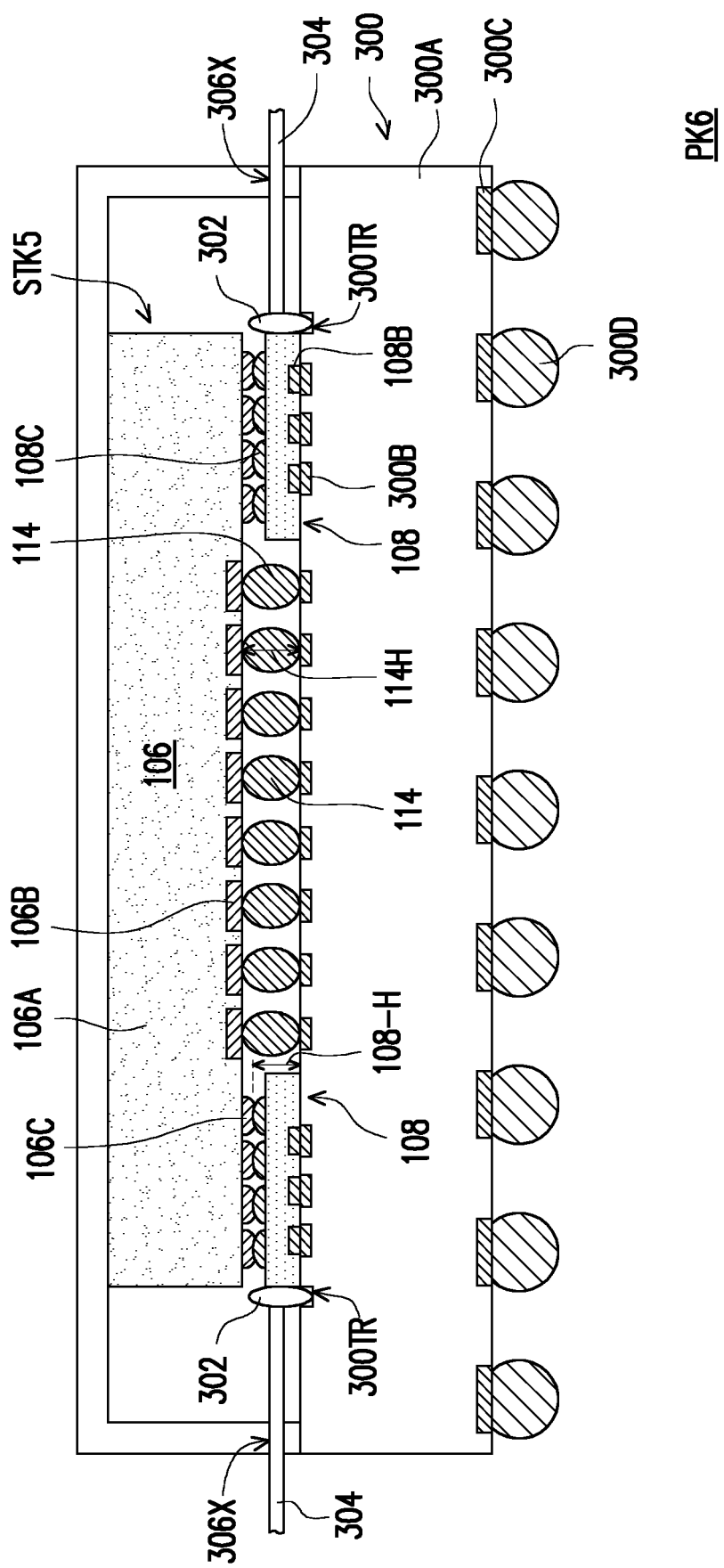
FIG. 7 is a schematic sectional view of a package structure according to some other exemplary embodiments of the present disclosure.

FIG. 7 is a schematic sectional view of a package structure according to some other exemplary embodiments of the present disclosure. The package structure PK6 illustrated in FIG. 7 is similar to the package structure PK5 illustrated in FIG. 6B. Therefore, the same reference numerals are used to refer to the same or liked parts, and its detailed description will be omitted herein. The difference between the embodiments is in the design of the stacked die package.

As illustrated in FIG. 7, in the exemplary embodiment, the through dielectric vias 112A and insulating encapsulant 110' shown in FIG. 6B may be further omitted from the package structure PK6 of FIG. 7. In some embodiments, the stacked die package STK5 may be directly bonded to the package component 300 through a plurality of conductive terminals 114. In certain embodiments, the plurality of conductive terminals 114 and the second conductive features 108B of the second semiconductor dies 108 may be physically and electrically attached to the bonding pads 300B for providing electrical connection therebetween. Furthermore, in some embodiments, a height 108-H of the plurality of second semiconductor dies 108 may be smaller than a height 114H of the conductive terminals 114. In some alternative embodiments, when conductive pads are used instead of conductive studs for the first bonding elements 106C and the second bonding elements 108C (as in FIG. 3), the height 108-H of the plurality of second semiconductor dies 108 may be substantially equal to the height 114H of the conductive terminals 114. In other words, the second semiconductor dies 108 may be located in the clearance of the conductive terminals 114.

Figure 8:
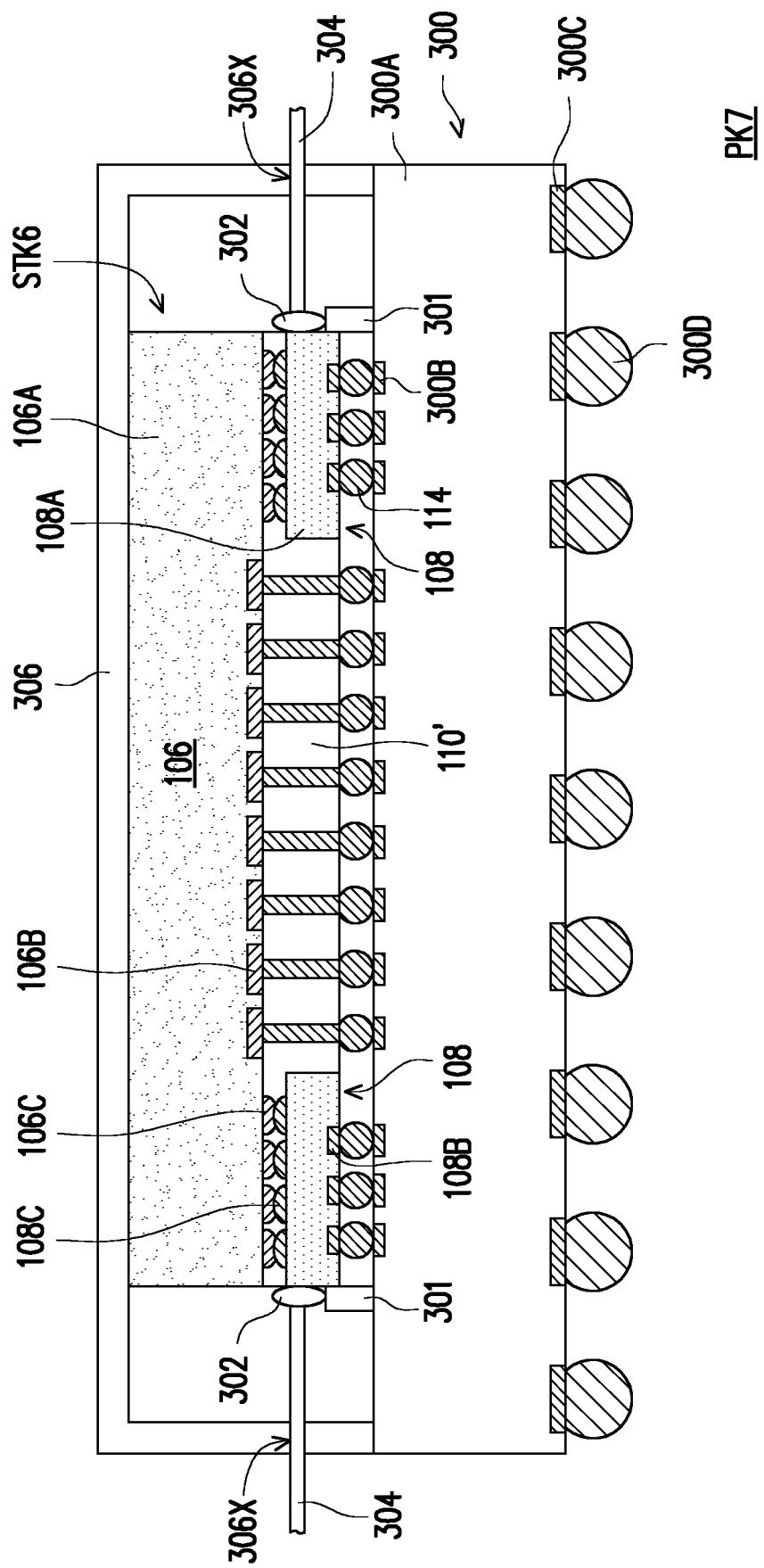
FIG. 8 is a schematic sectional view of a package structure according to some other exemplary embodiments of the present disclosure.

FIG. 8 is a schematic sectional view of a package structure according to some other exemplary embodiments of the present disclosure. The package structure PK7 illustrated in FIG. 8 is similar to the package structure PK2 illustrated in FIG. 2D. Therefore, the same reference numerals are used to refer to the same or liked parts, and its detailed description will be omitted herein.

As illustrated in FIG. 8, in the stacked die package STK6, the second semiconductor dies 108 are un-thinned semiconductor dies having thicknesses greater than the conductive terminals 114. In some embodiments, the un-thinned second semiconductor dies 108 are directly attached to the conductive terminals 114 through the second conductive features 108B. In certain embodiments, a bottom surface of the second semiconductor dies 108 is aligned with a bottom surface of the insulating encapsulant 110'. Furthermore, in some embodiments, prior to attaching the optical lens 302 to the second semiconductor dies 108, a plurality of lens housing 301 may be disposed on the package component 300. The lens housing 301 may be any type of polymeric material suitable for housing the optical lens 302. In certain embodiments, the optical lens 302 are attached to side surfaces of the second semiconductor dies 108, and the optical lens 302 are further located on the lens housing 301.

Figure 9A:
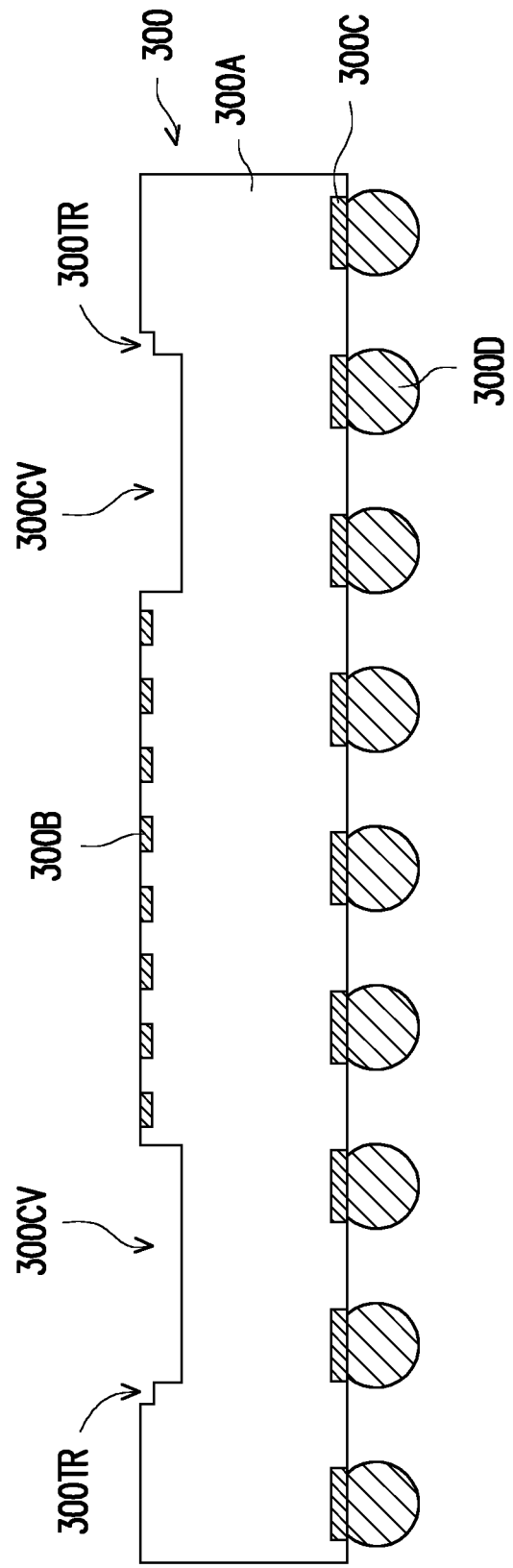
FIG. 9A to FIG. 9B are schematic views of various stages in a method of fabricating a package structure according to some other exemplary embodiments of the present disclosure.
Figure 9B:
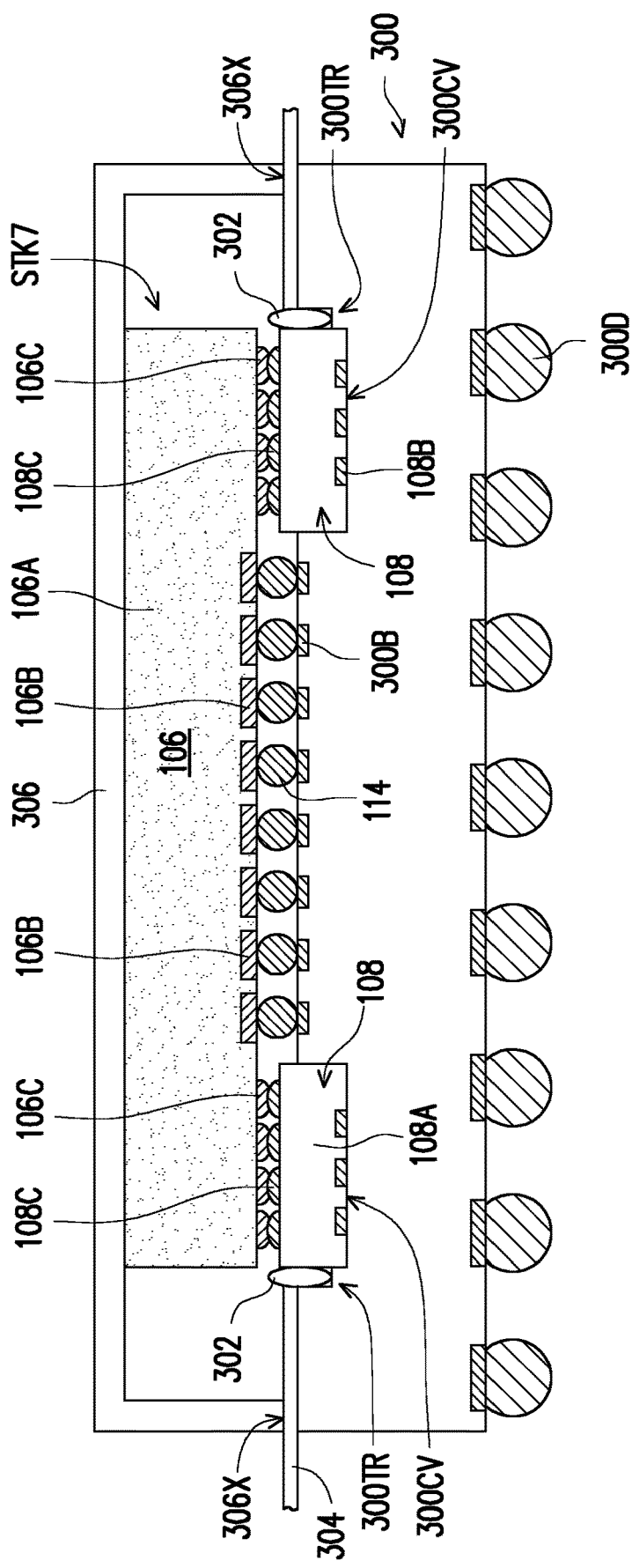

FIG. 9A to FIG. 9B are schematic views of various stages in a method of fabricating a package structure according to some other exemplary embodiments of the present disclosure. The method of fabricating the package structure PK8 illustrated in FIG. 9A to FIG. 9B is similar to the method of fabricating the package structure PK5 illustrated in FIG. 6A to FIG. 6C. Therefore, the same reference numerals are used to refer to the same or liked parts, and its detailed description will be omitted herein.

Referring to FIG. 9A a package component 300 is provided. In some embodiments, the package component 300 is patterned to define a plurality of trenches 300TR and a plurality of cavities 300CV in the substrate 300A. In some embodiments, a depth of the trenches 300TR is different than a depth of the cavities 300CV. In other words, the trenches 300TR and cavities 300CV may be defined in different steps. For example, the trenches 300TR may be defined in a first step, while the cavities 300CV may be defined in a second step by patterning the substrate 300A. In some embodiments, the trenches 300TR may be further joined with the cavities 300CV. Referring to FIG. 9B, in a next step, a stacked die package STK7 may be bonded to the package component 300 so that the plurality of optical lens 302 are disposed within the plurality of trenches 300TR of the package component 300. In some embodiments, the second semiconductor dies 108 are further disposed within the plurality of cavities 300CV. In certain embodiments, the second semiconductor dies 108 may be further electrically connected to circuits or electrical components (not shown) of the package component 300 through the second conductive features 108B.

Figure 10A:
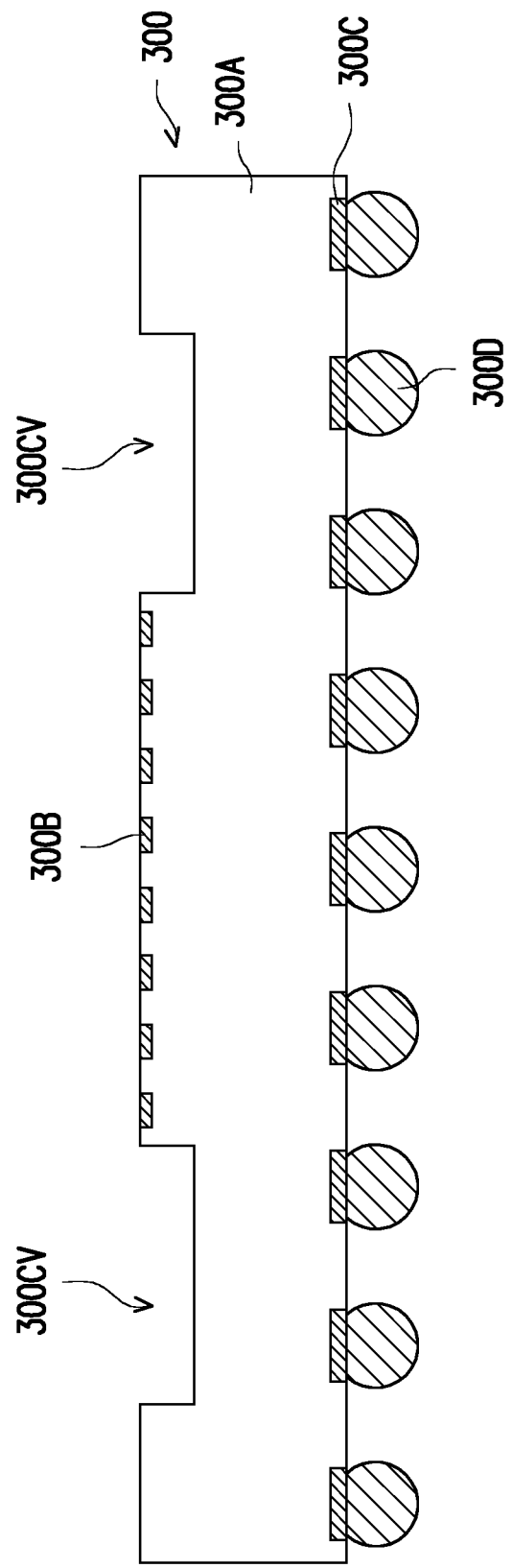
FIG. 10A to FIG. 10B are schematic views of various stages in a method of fabricating a package structure according to some other exemplary embodiments of the present disclosure.
Figure 10B:
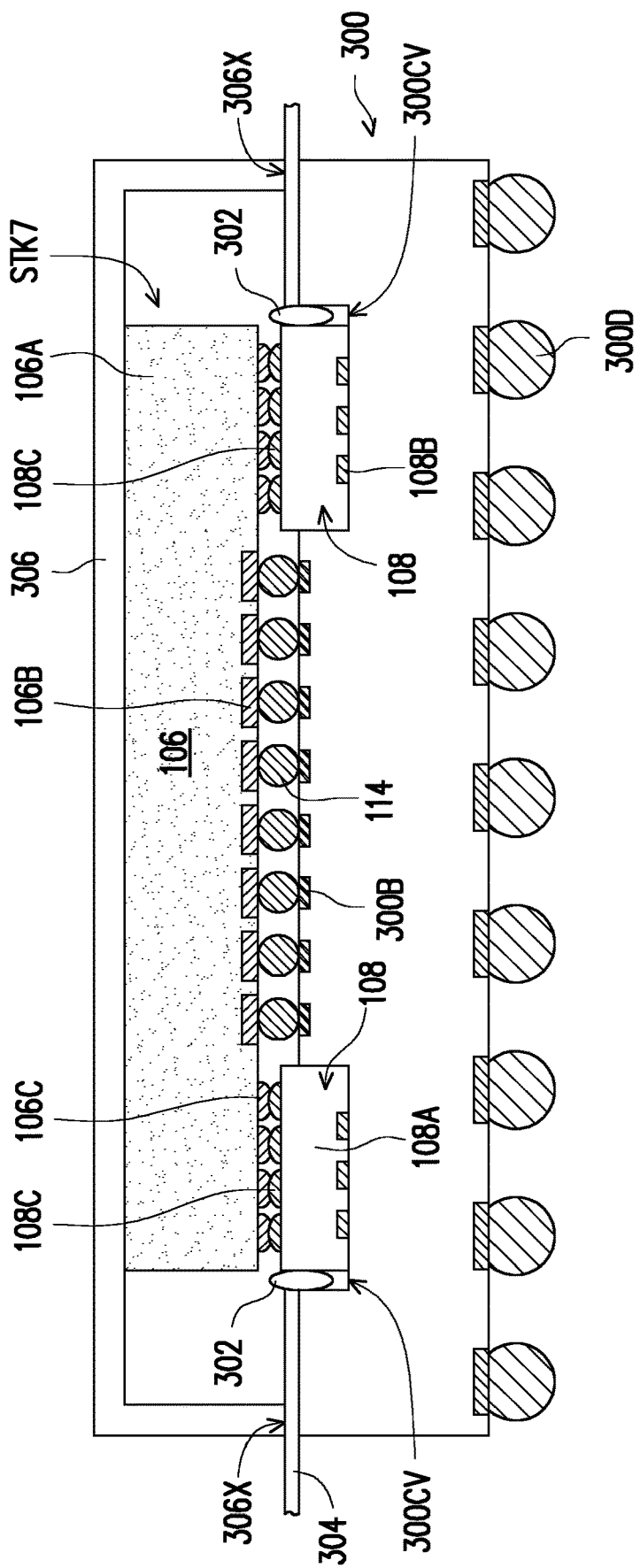

FIG. 10A to FIG. 10B are schematic views of various stages in a method of fabricating a package structure according to some other exemplary embodiments of the present disclosure. The method of fabricating the package structure PK9 illustrated in FIG. 10A to FIG. 10B is similar to the method of fabricating the package structure PK8 illustrated in FIG. 9A to FIG. 9B. Therefore, the same reference numerals are used to refer to the same or liked parts, and its detailed description will be omitted herein.

Referring to FIG. 10A a package component 300 is provided. In some embodiments, the package component 300 is patterned to define a plurality of cavities 300CV in the substrate 300A. Referring to FIG. 10B, in a next step, a stacked die package STK7 may be bonded to the package component 300 so that the plurality of optical lens 302 and the second semiconductor dies 108 are together disposed within the plurality of cavities 300CV.

In the above-mentioned embodiments, a plurality of second semiconductor dies (photonic dies) is attached to a first semiconductor die (electronic die) through hybrid bonding. As such, this allows the integration of photonic components and processor elements together in a stacked die package over the package components. By arranging the second semiconductor dies (photonic dies) in close proximity with the first semiconductor die (electronic die), the communication pathway between the first and second semiconductor dies is reduced. As such, this enables lower power consumption and higher bandwidth data transfers between processor and photonic elements.

In accordance with some embodiments of the present disclosure, a package structure includes a package component, a stacked die package, a plurality of optical fibers and a heat spreading structure. The stacked die package is disposed on and electrically connected to the package component. The stacked die package includes a first semiconductor die and a plurality of second semiconductor dies. The first semiconductor die has a plurality of first bonding elements. The second semiconductor dies are disposed on the first semiconductor die and have a plurality of second bonding elements, wherein the plurality of first bonding elements and the plurality of second bonding elements are facing one another and bonded together through hybrid bonding. The plurality of optical fibers is attached to the plurality of second semiconductor dies of the stacked die package. The heat spreading structure is disposed on the package component and surrounding the stacked die package.

In accordance with some other embodiments of the present disclosure, a package structure includes a package component, an electronic die, a plurality of photonic dies, a plurality of conductive terminals and a plurality of optical fibers. The electronic die is disposed on the package structure, wherein the electronic die includes a plurality of first bonding elements and a plurality of first conductive features. The photonic dies are disposed on the electronic die, wherein the plurality of photonic dies includes a plurality of second bonding elements and a plurality of second conductive features, the plurality of first bonding elements and the plurality of second bonding elements are facing one another and bonded together through hybrid bonding, and the plurality of first conductive features and the plurality of second conductive features are electrically connected to the package component. The conductive terminals are in between the package component and the electronic die and electrically connecting the electronic die to the package component.

In accordance with yet another embodiment of the present disclosure, a method of fabricating a package structure is described. The method includes the following steps. A first semiconductor die is placed on a carrier, wherein the first semiconductor die includes a plurality of first bonding elements. A plurality of second semiconductor dies are stacked on the first semiconductor to form a stacked die package, wherein the plurality of second semiconductor dies includes a plurality of second bonding elements, and the plurality of first bonding elements and the plurality of second bonding elements are facing one another and bonded together through hybrid bonding. A plurality of conductive terminals is formed on the first semiconductor die and the plurality of second semiconductor dies, and being electrically connected to the first semiconductor die and the plurality of second semiconductor dies. The carrier is de-bonded, and the stacked die package is bonded to a package component, wherein the stacked die package is electronically connected to the package component through the plurality of conductive terminals. A plurality of optical fibers is attached to the plurality of second semiconductor dies of the stacked die package. A heat spreading structure is disposed over the package component to surround the stacked die package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a package component;
   a stacked die package disposed on and electrically connected to the package component, wherein the stacked die package comprises:
      a first semiconductor die having a plurality of first bonding elements; and
      a plurality of second semiconductor dies disposed on the first semiconductor die and having a plurality of second bonding elements, wherein the plurality of first bonding elements and the plurality of second bonding elements are facing one another and bonded together through hybrid bonding; and
      an insulating encapsulant disposed on the first semiconductor die and encapsulating the plurality of second semiconductor dies, wherein side surfaces of the insulating encapsulant are aligned with side surfaces of the first semiconductor die;
   a plurality of optical fibers attached to the plurality of second semiconductor dies of the stacked die package; and
   a heat spreading structure disposed on the package component and surrounding the stacked die package.

2. The package structure according to claim 1, further comprising:
   a plurality of through dielectric vias disposed within the insulating encapsulant and electrically connected to the first semiconductor die and the plurality of second semiconductor dies; and
   a plurality of conductive terminals disposed over the insulating encapsulant and electrically connected to the plurality of through dielectric vias, wherein the stacked ide package is electrically connected to the package component through the plurality of conductive terminals.

3. The package structure according to claim 1, wherein a side surface of each of the plurality of second semiconductor dies is aligned with the side surfaces of the first semiconductor die, and the plurality of optical fibers is attached to the side surface of each of the plurality of second semiconductor dies.

4. The package structure according to claim 1, wherein the plurality of second semiconductor dies is disposed on the first semiconductor die to have an overlapping portion and a non-overlapping portion with the first semiconductor die, and the plurality of optical fibers is attached to a top surface of the non-overlapping portion of each of the plurality of second semiconductor dies.

5. The package structure according to claim 1, further comprising a plurality of optical lens attached to the plurality of second semiconductor dies of the stacked die package, wherein the plurality of optical fibers is attached to the plurality of second semiconductor dies through the plurality of optical lens.

6. The package structure according to claim 5, wherein the package component includes a plurality of trenches, and the plurality of optical lens is disposed within the plurality of trenches of the package component.

7. The package structure according to claim 1, wherein the package component includes a plurality of cavities, and the plurality of second semiconductor dies is further disposed within the plurality of cavities.

8. A package structure, comprising:
a package component;
an electronic die disposed on the package component, wherein the electronic die includes a plurality of first bonding elements and a plurality of first conductive features;
a plurality of photonic dies disposed on the electronic die, wherein the plurality of photonic dies includes a plurality of second bonding elements and a plurality of second conductive features, the plurality of first bonding elements and the plurality of second bonding elements are facing one another and bonded together through hybrid bonding, and the plurality of first conductive features and the plurality of second conductive features are electrically connected to the package component;
a plurality of conductive terminals disposed in between the package component and the electronic die and electrically connecting the electronic die to the package component; and
a plurality of optical fibers attached to the plurality of photonic dies.

9. The package structure according to claim 8, further comprising:
an insulating encapsulant disposed on the electronic die and surrounding the plurality of photonic dies; and
a plurality of through dielectric vias disposed within the insulating encapsulant and electrically connected to the plurality of first conductive features of the electronic die.

10. The package structure according to claim 9, wherein a bottom surface of the plurality of photonic dies is aligned with a bottom surface of the insulating encapsulant.

11. The package structure according to claim 8, wherein a height of the plurality of photonic dies is smaller than or substantially equal to a height of the plurality of conductive terminals.

12. The package structure according to claim 8, wherein a side surface of each of the plurality of photonic dies is aligned with side surfaces of the electronic die, and the plurality of optical fibers is attached to the side surface of each of the plurality of photonic dies.

13. The package structure according to claim 8, wherein the plurality of photonic dies is disposed on the electronic die to have an overlapping portion and a non-overlapping portion with the electronic die, and the plurality of optical fibers is attached to a top surface of the non-overlapping portion of each of the plurality of photonic dies.

14. The package structure according to claim 8, further comprising a plurality of optical lens attached to the plurality of photonic dies, wherein the plurality of optical fibers is attached to the plurality of photonic dies through the plurality of optical lens.

15. The package structure according to claim 14, wherein the package component includes a plurality of trenches, and the plurality of optical lens is disposed within the plurality of trenches of the package component.

16. A method of fabricating a package structure, comprising:
placing a first semiconductor die on a carrier, wherein the first semiconductor die includes a plurality of first bonding elements;
stacking a plurality of second semiconductor dies on the first semiconductor to form a stacked die package, wherein the plurality of second semiconductor dies includes a plurality of second bonding elements, and the plurality of first bonding elements and the plurality of second bonding elements are facing one another and bonded together through hybrid bonding;
forming an insulating encapsulant on the first semiconductor die to encapsulate the plurality of second semiconductor dies, wherein side surfaces of the insulating encapsulant are aligned with side surfaces of the first semiconductor die;
forming a plurality of conductive terminals on the first semiconductor die and the plurality of second semiconductor dies, and being electrically connected to the first semiconductor die and the plurality of second semiconductor dies;
de-bonding the carrier;
bonding the stacked die package to a package component, wherein the stacked die package is electronically connected to the package component through the plurality of conductive terminals;
attaching a plurality of optical fibers to the plurality of second semiconductor dies of the stacked die package; and
disposing a heat spreading structure over the package component to surround the stacked die package.

17. The method according to claim 16, further comprising:
forming a plurality of through dielectric vias within the insulating encapsulant and electrically connected to the first semiconductor die and the plurality of second semiconductor dies, wherein the plurality of conductive terminals is formed on the insulating encapsulant and electrically connected to the plurality of through dielectric vias.

18. The method according to claim 16, further comprising attaching a plurality of optical lens to the plurality of second semiconductor dies of the stacked die package prior to attaching the plurality of optical fibers, and attaching the plurality of optical fibers to the plurality of second semiconductor dies through the plurality of optical lens.

19. The method according to claim 16, further comprising:
   forming a plurality of trenches in the package component; and
   bonding the stacked die package to the package component so that the plurality of optical lens is disposed within the plurality of trenches of the package component.

20. The method according to claim 16, further comprising:
   forming a plurality of cavities in the package component; and
   bonding the stacked die package to the package component so that the plurality of second semiconductor dies is further disposed within the plurality of cavities.

* * * * *